United States Patent
Yoon et al.

(10) Patent No.: US 10,026,473 B2
(45) Date of Patent: Jul. 17, 2018

(54) NON-VOLATILE MEMORY DEVICE FOR SELECTIVELY PERFORMING RECOVERY OPERATION AND METHOD OF OPERATING THE SAME

(71) Applicant: SAMSUNG ELECTRONICS CO., LTD., Suwon-si, Gyeonggi-Do (KR)

(72) Inventors: Hyun-Jun Yoon, Changwon-si (KR); Jae-Woo Im, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/288,758

(22) Filed: Oct. 7, 2016

(65) Prior Publication Data

US 2017/0125091 A1    May 4, 2017

(30) Foreign Application Priority Data

Nov. 4, 2015 (KR) .................. 10-2015-0154771

(51) Int. Cl.
| | |
|---|---|
| G11C 11/56 | (2006.01) |
| G11C 16/20 | (2006.01) |
| G11C 16/34 | (2006.01) |
| G11C 16/04 | (2006.01) |
| G11C 7/08 | (2006.01) |
| G11C 16/32 | (2006.01) |

(52) U.S. Cl.
CPC .......... G11C 11/5642 (2013.01); G11C 7/08 (2013.01); G11C 11/5628 (2013.01); G11C 16/20 (2013.01); G11C 16/3404 (2013.01); G11C 16/0483 (2013.01); G11C 16/32 (2013.01)

(58) Field of Classification Search
CPC . G11C 11/5642; G11C 16/0483; G11C 16/20; G11C 11/3404; G11C 11/5628
See application file for complete search history.

(56) References Cited

U.S. PATENT DOCUMENTS

| | | | |
|---|---|---|---|
| 8,244,968 | B2 | 8/2012 | Chae |
| 8,582,360 | B2 | 11/2013 | Park et al. |
| 2006/0146612 | A1* | 7/2006 | Lim ............ G11C 16/26 365/185.21 |
| 2008/0235442 | A1 | 9/2008 | Chae |

(Continued)

FOREIGN PATENT DOCUMENTS

| | | |
|---|---|---|
| KR | 1020060079745 | 7/2006 |
| KR | 1020100022282 | 3/2010 |

(Continued)

*Primary Examiner* — Tri Hoang
(74) *Attorney, Agent, or Firm* — F. Chau & Associates, LLC

(57) ABSTRACT

A non-volatile memory device for selectively performing a recovery operation and a method of operating the same are provided. The method of operating a non-volatile memory device includes receiving a first read command, performing a first sensing operation in response to the first read command, and receiving a second read command. The method further includes completing a memory operation corresponding to the first read command without performing a recovery operation when the second read command is received before the first sensing operation is completed, and performing a second sensing operation in response to the second read command.

20 Claims, 22 Drawing Sheets

(56) References Cited

U.S. PATENT DOCUMENTS

| | | |
|---|---|---|
| 2009/0031075 A1 | 1/2009 | Kim |
| 2014/0063950 A1 | 3/2014 | Baek et al. |
| 2014/0063961 A1 | 3/2014 | Sakai et al. |
| 2014/0204684 A1* | 7/2014 | Kwak ............... G11C 7/10 365/189.05 |
| 2014/0241069 A1* | 8/2014 | Kwak ............... G11C 16/26 365/185.22 |
| 2015/0003169 A1* | 1/2015 | Nam ............... G11C 16/26 365/185.25 |
| 2015/0006791 A1 | 1/2015 | Yoo et al. |
| 2015/0049545 A1 | 2/2015 | Jo et al. |

FOREIGN PATENT DOCUMENTS

| | | |
|---|---|---|
| KR | 1020140028571 | 3/2014 |
| KR | 1020150003571 | 1/2015 |
| KR | 1020150020431 | 2/2015 |
| KR | 1020150055884 | 5/2015 |

\* cited by examiner

FIG. 10

| | WL | BL | Pump |
|---|---|---|---|
| DELETE RECOVERY PERIOD | BIAS DISCHARGE × | BIAS DISCHARGE × | INITIALIZE OUTPUT × |
| MAINTAIN RECOVERY PERIOD (SKIP SOME PORTION) | BIAS DISCHARGE ○ | BIAS DISCHARGE × | INITIALIZE OUTPUT × |
| | BIAS DISCHARGE ○ | BIAS DISCHARGE × | INITIALIZE SOME OUTPUTS ○ |
| | BIAS DISCHARGE × | BIAS DISCHARGE ○ | INITIALIZE OUTPUT × |
| | BIAS DISCHARGE × | BIAS DISCHARGE ○ | INITIALIZE SOME OUTPUTS ○ |

NON-VOLATILE MEMORY DEVICE FOR SELECTIVELY PERFORMING RECOVERY OPERATION AND METHOD OF OPERATING THE SAME

CROSS-REFERENCE TO RELATED APPLICATION

This application claims priority under 35 U.S.C, § 119 to Korean Patent Application No. 10-2015-0154771, filed on Nov. 4, 2015, in the Korean intellectual Property Office, the disclosure of which is incorporated by reference herein in its entirety.

TECHNICAL FIELD

Exemplary embodiments of the inventive concept relate to a non-volatile memory device, and more particularly, to a non-volatile memory device for improving a recovery operation, and a method of operating the same.

DISCUSSION OF THE RELATED ART

Presently non-volatile memory devices are widely used in modern day electronic devices. For example, a flash memory system is widely being used in a universal serial bus (USB) drive, a digital camera, a mobile phone, a smart phone, a tablet personal computer (PC), a memory card, and a solid state disk/drive (SSD). It may be desirable for a memory system such as the non-volatile memory device to increase its capacity and memory operating speed when performing a write operation, a read operation, etc.

In a memory operation of the non-volatile memory system, a setup period may be performed on various kinds of lines before performing the read operation, the write operation, etc. In addition, a recovery period may be performed as an initialization operation on the various kinds of lines after performing the read operation, the write operation, etc. However, utilization of the setup period or the recovery period described above may increase an amount of time used for an entire operation of the memory, and may also increase its power consumption.

SUMMARY

Provided are one or more exemplary embodiments of the present inventive concept that include a non-volatile memory device capable of decreasing a time used for a memory operation, and also decreasing power consumption, and a method of operating the same.

According to an exemplary embodiment of the present inventive concept, the method of operating a nonvolatile memory device includes receiving a first read command, performing a first sensing operation in response to the first read command, and receiving a second read command. The method further includes completing a memory operation corresponding to the first read command without performing a recovery operation when the second read command is received before the first sensing operation is completed, and performing a second sensing operation in response to the second read command.

According to an exemplary embodiment of the present inventive concept the method of operating a non-volatile memory device includes performing a first memory operation in response to a receiving first command and a first address, and receiving a second command and a second address. The method further includes determining an amount of time taken to receive the second command, and selectively deleting a recovery period included in the first memory operation according to the amount of time taken to receive the second command.

According to an exemplary embodiment of the present inventive concept the method of operating a non-volatile memory device includes receiving a first read command, performing a first sensing operation in response to the first read command, and receiving a second command. The method further includes determining whether the second command is a second read command, and performing a recovery operation in a first memory operation corresponding to the first read command when the second command is not the second read command. The method further includes skipping the recovery operation in the first memory operation corresponding to the first read command when the second command is the second read command and when the second read command is received before the first sensing operation is completed, and performing second sensing operation in response to the second read command.

BRIEF DESCRIPTION OF THE DRAWINGS

The above and other features of the inventive concept will become more apparent by describing in detail exemplary embodiments thereof, with reference to the accompanying drawing in which:

FIG. 10 is a table illustrating an example of various skips of a recovery operation according to an exemplary embodiment of the present inventive concept;

DETAILED DESCRIPTION OF THE EMBODIMENTS

Figure 1:
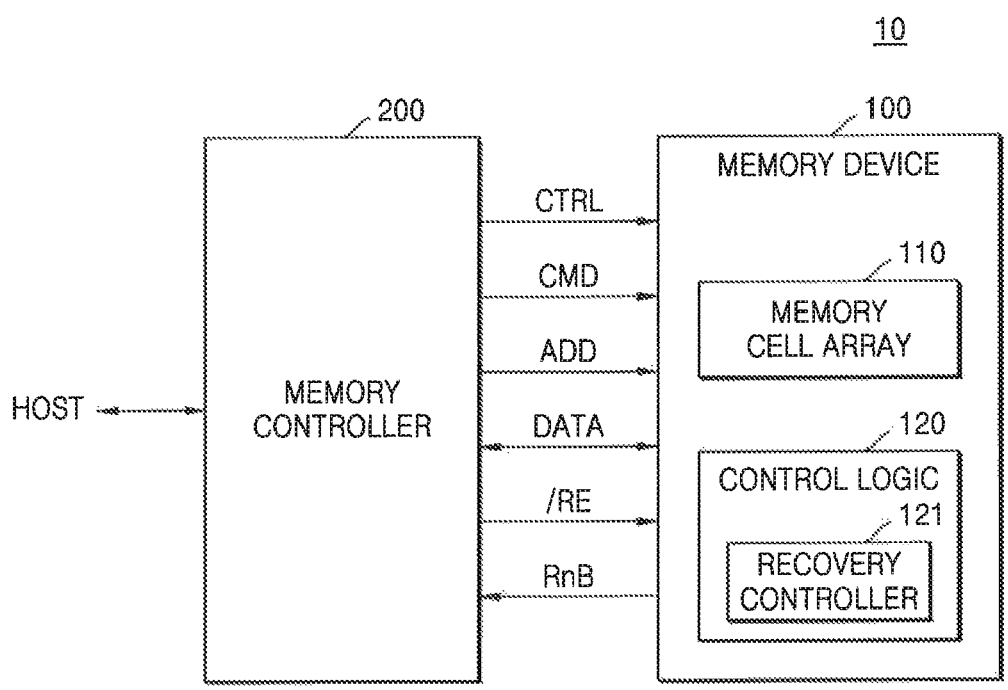
FIG. 1 is a block diagram illustrating a memory system according to an exemplary embodiment of the present inventive concept.

Exemplary embodiments of the present inventive concept will be described in detail with reference to the accompanying drawings. The exemplary embodiments of the present inventive concept are provided so that this disclosure will be thorough and complete, and will fully convey the concept of exemplary embodiments of the present inventive concept to those skilled in the art. The exemplary embodiments of the present inventive concept may be embodied in many different forms, and will be described with reference to the accompanying drawings illustrating specific exemplary embodiments of the present inventive concept. However, this is not intended to limit the exemplary embodiments of the present inventive concept to particular modes of practice, and it is to be appreciated that all changes, equivalents, and substitutes do not depart from the spirit and technical scope of the present inventive concept. When describing each drawing, like reference numerals may denote like elements in the accompanying drawings. In the accompanying drawings, sizes of components may be exaggerated or reduced for clarity.

It will be understood that although the terms "first," "second," etc. may be used herein to describe various components, these components should not be limited by these terms. These components are only used to distinguish one component from another. For example, a first element could be termed a second element, without departing from the scope of the inventive concept, and similarly, the second element could be termed the first element.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

FIG. 1 is a block diagram illustrating a memory system according to an exemplary embodiment of the present inventive concept. A memory system 10 may include a memory device 100 and a memory controller 200, in an exemplary embodiment of the present inventive concept, the memory device 100 may be a non-volatile memory device storing data in the non-volatile manner. For example, the memory device 100 may be a flash memory device including flash memory cells. Alternatively, the memory device 100 may be a memory device such as a resistive random access memory (ReRAM), a magnetic random access memory (MRAM), a phase change random access memory (PRAM), etc. When describing exemplary embodiments of the present inventive concept, it may be assumed that the memory device 100 is the flash memory device including NAND or NOR flash memory cells.

The memory controller 200 may control the memory device 100 to read data stored in the memory device 100 or write data in the memory device 100 in response to a write/read request from a host HOST. For example, the memory controller 200 may control a program (or write), read, and erase operations on the memory device 100 by providing a command CMD, an address ADD, and a control signal CTRL to the memory device 100. Further, data DATA that is to be written and data DATA that is to be read may be transceived between the memory controller 200 and the memory device 100.

The memory controller 200 may communicate with an external host HOST using various standard interfaces. For example, the memory controller 200 may include a host interface, and the host interface may provide various kinds of standard interfaces between the host and the memory controller 200. The standard interface may include various interface methods, such as, for example, an advanced technology attachment (ATA), a serial ATA (SATA), an external-SATA (e-SATA), a small computer small interface (SCSI), a serial attached SCSI (SAS), a peripheral component interconnection (PCI), a PCI-express (PCI-E), institute of electrical and electronics engineers (IEEE) 1394, a universal serial bus (USB), a secure digital (SD) card interface, a multimedia card (MMC) interface, an embedded multimedia card (eMMC) interface, a universal flash storage (UFS) device interface, a compact flash (CF) card interface, etc.

According to an exemplary embodiment of the present inventive concept a memory cell array 110 includes the flash memory cells. When the memory cell array 110 includes flash memory cells, the memory cell array 110 may include a plurality of NAND strings, and each NAND string may include memory cells connected to each of a plurality of word lines which are stacked vertically on a substrate. In an exemplary embodiment of the present inventive concept, the memory cell array 110 may be a three-dimensional (3D) memory array. In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. Nos. 2011/02.33648; 2012/0051138; and 2011/0204420.

A control logic 120 may control overall operations of the memory device 100. For example, the memory device 100 may be controlled so that a memory operation corresponding to a command CMD provided from the memory controller 200 is performed. As an example, the control logic 120 may generate various kinds of control signals used in the memory device 100 in response to a control signal CTRL. According to an exemplary embodiment of the present inventive concept, the control logic 120 may control a voltage level provided to word lines and bit lines when performing the memory operation, such as, for example the read operation.

Each of the memory operations such as the write and read operations, etc., may include one or more periods of operation. For example, when the read operation is requested from the memory controller 200 by the host HOST, the control logic 120 may control various kinds of function blocks inside the memory device 100 so that the memory operation including a setup period, a sensing period, a recovery period, and a dump period is performed. For example, in the setup period, a level of voltage for a word line may be generated, and the generated voltage level may be provided to a selected word line and unselected word lines. Further, in the sensing period, a voltage of the bit lines precharged to a predetermined voltage level may be developed according to data stored in the memory cell. In the recovery period, the recovery operation on the word lines and/or the bit lines may be performed, and in the dump period, data read by the sensing operation and stored in a page buffer may be transferred to an input and output buffer.

According to an exemplary embodiment of the present inventive concept, the control logic 120 may include a recovery controller 121. The recovery controller 121 may control the recovery operation on the word lines and/or the bit lines of the memory device 100 in the recovery period included in the memory operation.

Further, the memory controller 200 and the memory device 100 may transceive various kinds of request signals and information signals. For example, when the data DATA is transferred from the page buffer to the input and output buffer in the dump period, the memory device 100 may provide the data DATA stored in the input and output buffer to the memory controller 200 according to a data request signal /RE transferred from the memory controller 200.

The memory device 100 may provide a ready/busy signal RnB representing an internal operation state to the memory controller 200. In an exemplary embodiment, when the sensing period is completed or the dump period is completed, the ready/busy signal RnB may be transitioned to a logic high H. Further, when the ready/busy signal RnB is in the logic high H, the memory controller 200 may provide the command CMD to the memory device 100. Alternatively, when the command CMD is provided from the memory controller 200, the ready/busy signal RnB may be transitioned to a logic low L, and when the ready/busy signal RnB is in the logic low L, the memory device 100 may perform the internal memory operation such as, for example, the sensing period, etc.

According to an exemplary embodiment of the present inventive concept, the control logic 120 may perform various kinds of determination operations using the command CMD and/or the address ADD transferred from the memory controller 200, and selectively deletes the recovery period in the memory operation according to the determination result. For example, when a memory operation that is indicated by a command CMD is determined and the command CMD representing the same memory operation is continuously received, the recovery period may be deleted from the memory operation. When the same kind of command (for example, a second read command) is received while a sensing operation corresponding to a first read command is performed as a first read command is received, the recovery period may be deleted from the memory operation corresponding to the first read command.

Further, according to an exemplary embodiment of the present inventive concept, it may be determined whether to delete the recovery period by further using a result obtained by determining the address ADD provided together with the command CMD. For example, even when the read command is continuously received, whether to delete the recovery period may be determined using the result obtained by determining the address ADD. While the sensing operation corresponding to the first read command is performed as the first read command and a first address are received, the second read command and a second address may be received. In this case, the first address and the second address may be compared, and whether to delete the recovery period from the memory operation corresponding to the first read command may be determined according to the comparison result. For example, when the first address and the second address are different from each other, the recovery operation may be performed after the sensing period without deleting the recovery period from the memory operation corresponding to the first read command.

The memory system 10 according to exemplary embodiments of the present inventive concept described above may reduce a time used for the memory operation since it is not necessary to perform the recovery operation whenever the memory operation is performed. Thus, a latency time of the memory operation may be decreased. Further, power consumption may be reduced since it is not necessary to change various kinds of lines to an initialization state with the recovery operation.

The memory device 100 and the memory controller 200 may be integrated as one semiconductor device. For example, the memory device 100 and the memory controller 200 may be integrated as one semiconductor device, and may form a memory card. For example, the memory device 100 and the memory controller 200 may be integrated as one semiconductor device, and may form a personal computer memory card international association (PCMCIA), a compact flash (CF) card, a smart media (SM) card (SMC), a memory stick, a multimedia card (MMC, RS-MMC, MMC-micro), a secure digital (SD, miniSD, microSD) card, a universal flash storage (UFS), etc. As another example, the memory device 100 and the memory controller 200 may be integrated as one semiconductor device, and may form a solid state disk/drive (SSD).

Figure 2:
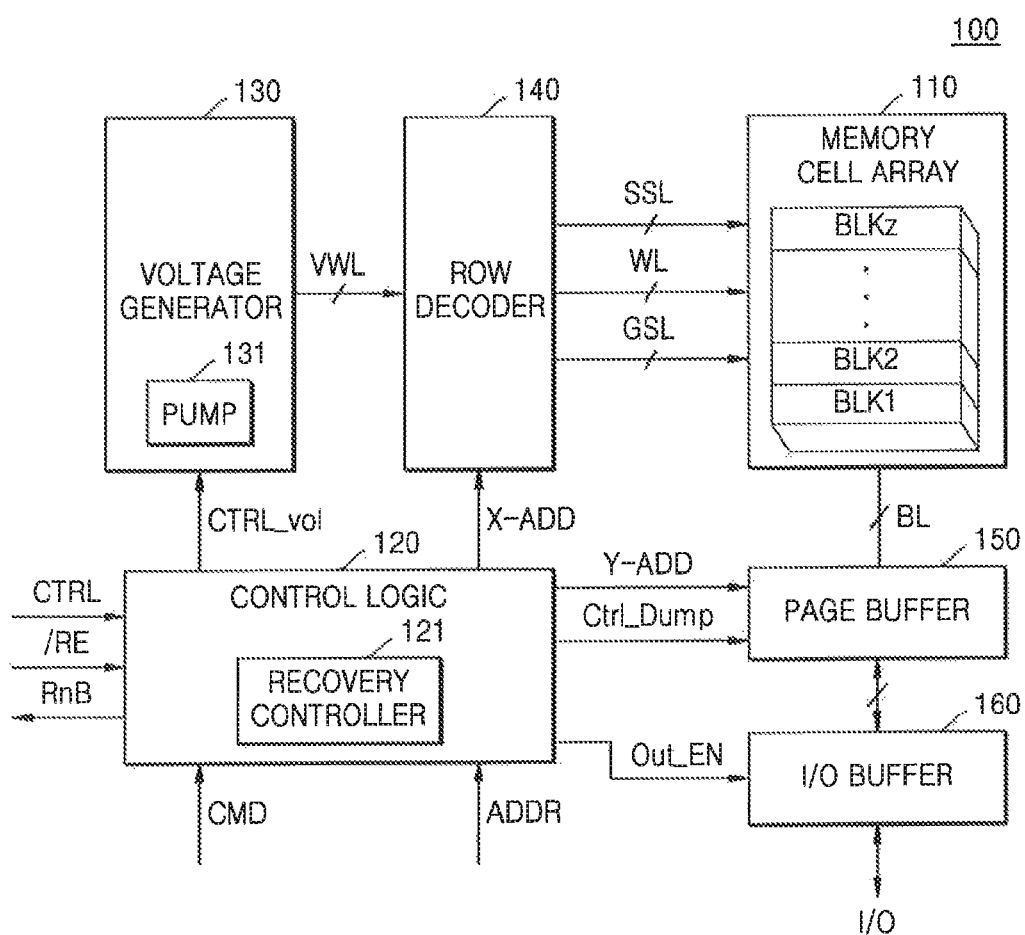
FIG. 2 is a block diagram illustrating an example implementation of the memory device illustrated in FIG. 1 according to an exemplary embodiment of the present inventive concept.

FIG. 2 is a block diagram illustrating an example implementation of the memory device shown FIG. 1, according to an exemplary embodiment of the present inventive concept.

Referring to FIG. 2, the memory device 100 may include a memory cell array 110, a control logic 120, a voltage generator 130, a row decoder 140, a page buffer 150, and an input and output buffer 160. Further, the control logic 120 may include a recovery controller 121. The memory device 100 may further include various kinds of function blocks related to various memory operations, respectively, such as an input and output interface, etc.

The memory cell array 110 may include a plurality of memory cells. The plurality of memory cells may be connected to word lines WL, a string selection line SSL, a ground selection line GSL, and bit lines BL. For example, the memory cell array 110 may be connected to the row decoder 140 through the word lines WL, the string selection line SSL, and the ground selection line GSL. In addition, the memory cell array 110 may be connected to the page buffer 150 through the bit lines BL.

The memory cell array 110 may include a plurality of blocks BLK1 to BLKz. Each block may have a two-dimensional structure (e.g., a planar structure), or a three-dimensional structure (e.g., a vertical structure). The blocks BLK1 to BLKz may be selected by the row decoder 140. For example, the row decoder 140 may select a block corresponding to a block address among the blocks BLK1 to BLKz. The memory cell array 110 may include at least one from among a single level cell block including single level cells, a multilevel cell block including multilevel cells, and a triple level cell block including triple level cells. As an example, some of the plurality of blocks BLK1 to BLKz included in the memory cell array 110 may be the single level cell blocks, and remaining blocks may be the multilevel cell blocks or the triple level cell blocks.

The control logic 120 may write data in the memory cell array 110, read the data from the memory cell array 110, or output various kinds of internal control signals for erasing the data stored in the memory cell array 110, based on the command CMD, the address ADD, and the control signal CTRL transferred from the memory controller 200.

Further, the control logic 120 may output the various kinds of internal control signals to the voltage generator 130, the row decoder 140, the page buffer 150, and the input and output buffer 160. For example, the control logic 120 may provide a voltage control signal CTRL_vol to the voltage generator 130. The voltage generator 130 may include one or more pumps 131, and generate voltages having various levels according to a pumping operation based on the voltage control signal CTRL_vol.

The control logic 120 may provide a row address X-ADD to the row decoder 140, and provide a column address Y-ADD to the page buffer 150. Further, when the data read according to the sensing operation (or, the read operation) is stored in the page buffer 150, the data of the page buffer 150 may be transferred to the input and output buffer 160 in response to a dump control signal Ctrl_Dump transmitted by the control logic 120. Further, the data stored in the input and output buffer 160 may be provided to a device outside of the memory device 100 (for example, the memory controller) in response to an output enable signal Out_EN transferred from the control logic 120.

The control logic 120 may output the ready/busy signal RnB representing a state of the memory device 100, receive the data request signal /RE requesting an output of the read data, and activate the output enable signal Out_EN in response to the data request signal /RE. Further, the control logic 120 may perform various kinds of determination operations using the command CMD and/or the address ADD according to the embodiments described above, and the recovery controller 121 may selectively perform the recovery operation according to the determination result.

Figure 3:
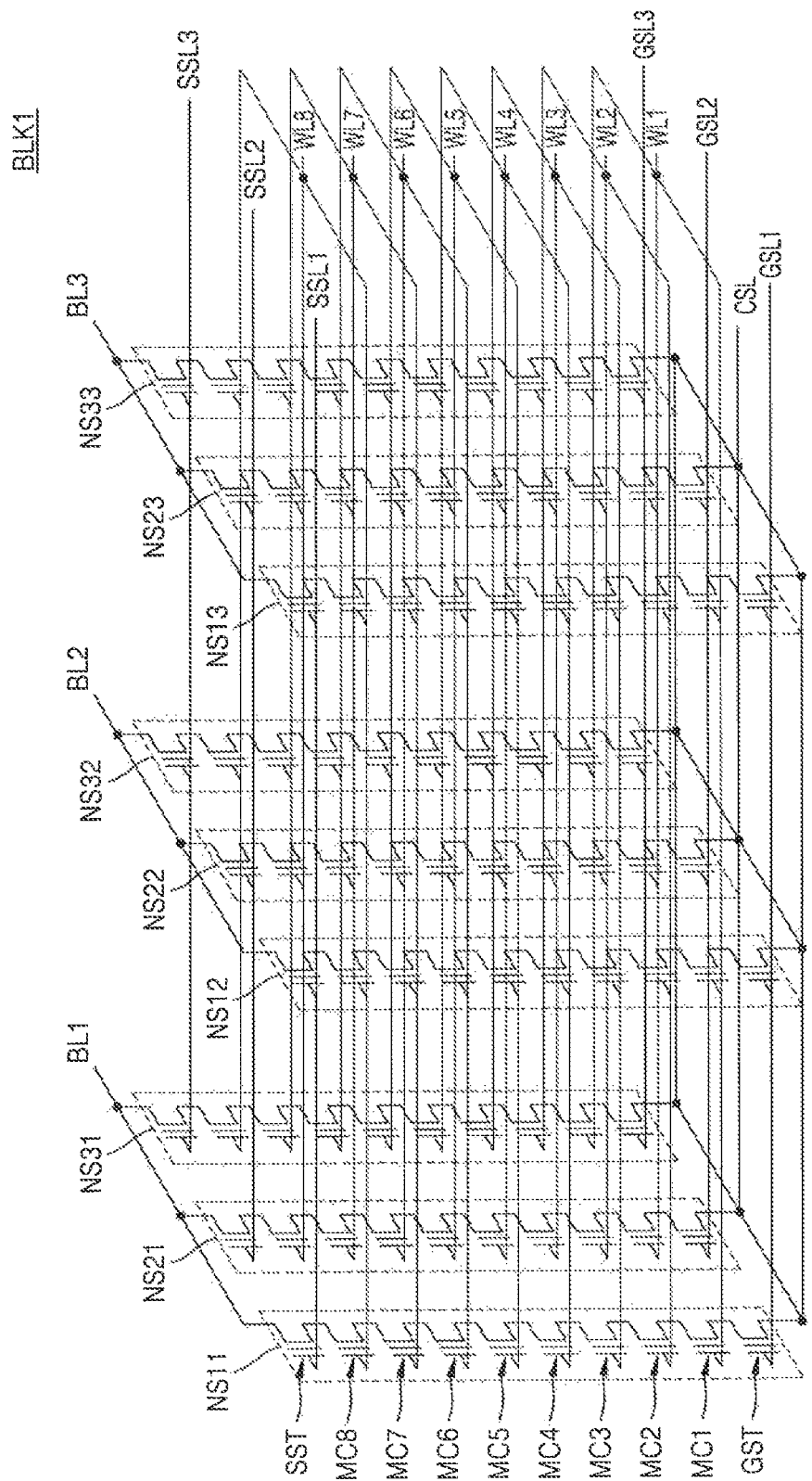
FIG. 3 is a circuit diagram illustrating an equivalent circuit of a first block shown in FIG. 2 according to an exemplary embodiment of the present inventive concept.

FIG. 3 is a circuit diagram illustrating an equivalent circuit of a first block BLK1 illustrated in FIG. 2, according to an exemplary embodiment of the present inventive concept.

Referring to FIG. 3, the first block BLK1 may be a NAND flash memory having a vertical structure. Each of the blocks BLK1 to BLKz shown in FIG. 2 may be implemented as the equivalent circuit shown in FIG. 3. The first block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of NAND strings, the number of word lines, the number of bit lines, the number of ground selection lines, and the number of string selection lines may be variously changed according to an exemplary embodiment of the present inventive concept.

The NAND strings NS11, NS21, and NS31 may be provided between the first bit line BL1 and the common source line CSL. In addition, the NAND strings NS12, NS22, and NS32 may be provided between the second bit line BL2 and the common source line CSL. The NAND strings NS13, NS23, and NS33 may be provided between the third bit line BL3 and the common source line CSL. Each NAND string (for example, NS11) may include a string selection transistor SST, a plurality of memory cells MC1 to MC8, and a ground selection transistor GST, which are connected in series. Hereinafter, the NAND string may be referred to as a string.

The strings commonly connected to one bit line may form one column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

The strings connected to one string selection line may form one row. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistors SST may be connected to corresponding string selection lines SSL1 to SSL3, respectively. The plurality of memory cells MC1 to MC8 may be connected to corresponding word lines WL1 to WL8, respectively. The ground selection transistors GST may be connected to corresponding ground selection lines GSL1 to GSL3, respectively. The string selection transistors SST may be connected to corresponding bit lines BL1 to BL3, respectively, and the ground selection transistors GST may be connected to the common source line CSL.

Although FIG. 3 illustrates the string selection lines SSL1 to SSL3 being separated from each other and the ground selection lines GSL1 to GSL3 being separated from each other, exemplary embodiments of the present inventive concept are not limited thereto. For example, in exemplary embodiments the string selection lines SSL1 to SSL3 may be commonly connected, and the ground selection lines GSL1 to GSL 3 may be commonly connected.

Figure 4:
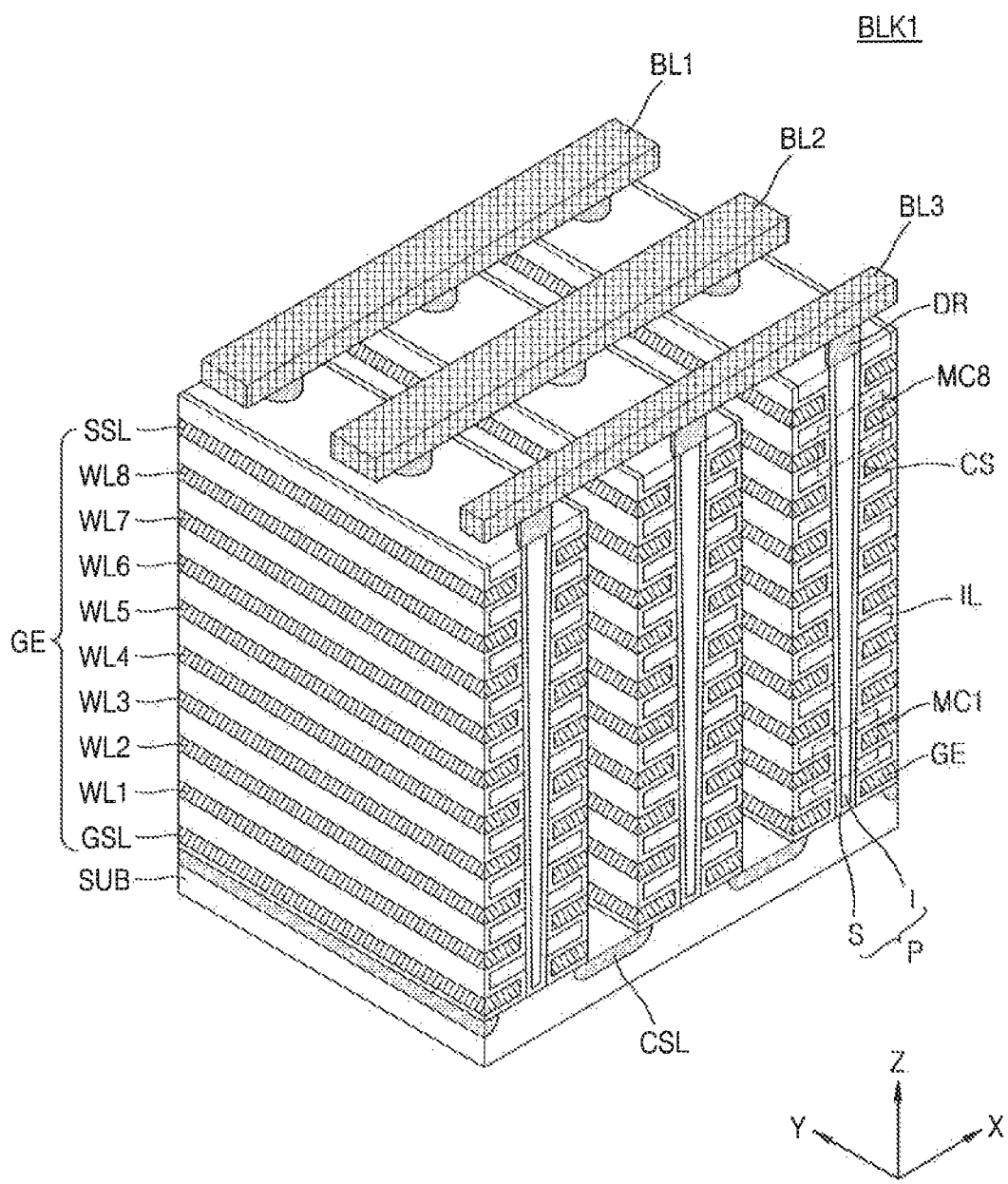
FIG. 4 is a perspective view illustrating an example implementation of a first block which is one among a plurality of blocks illustrated in FIG. 2 according to an exemplary embodiment of the present inventive concept.

FIG. 4 is a perspective view illustrating an example of an implementation of the first block, which is one from among the plurality of blocks illustrated in FIG. 2, according to exemplary embodiments of the present inventive concept.

Referring to FIG. 4, the first block BLK1 may be formed in a vertical direction from a substrate SUB. In FIG. 4, the first block BLK1 includes two selection lines GSL and SSL, eight word lines WL1 to WL8, and three bit lines BL1 to BL3. However, the number of selection lines GSL and SSL, word lines WL1 and WL2 and bit lines BL1 to BL3 is not limited thereto. For example, exemplary embodiments may include more or less selection lines SSL and GSL, word lines WL1 and WL2 and bit lines BL1 and BL3 compared to the exemplary embodiment shown in FIG. 4.

The substrate SUB may have a first conductive type (for example, a p-type) and be extended in a first direction (for example, in a direction of a Y-axis) on the substrate SUB. In addition, the common source line CSL in which impurities having a second conductive type (for example, an n-type) are doped may be provided. A plurality of insulating films IL extended along the first direction on a region of the substrate SUB between two adjacent common source lines CSL may be sequentially provided along a third direction (for example, in a direction of a Z-axis). Further, the plurality of insulating films IL may be spaced apart from each other by a specific distance along the third direction. For example, the plurality of insulating films IL may include an insulating material such as, for example, a silicon oxide.

A plurality of pillars P sequentially arranged along the first direction and penetrating the plurality of insulating films IL along the third direction may be provided on the region of the substrate SUB between two adjacent common source lines CSL. For example, the plurality of pillars P may be in contact with the substrate SUB by penetrating the plurality of insulating films IL. For example, a surface layer S of each pillar P may include a silicon material having a first type, and may function as a channel region. An internal layer I of each pillar P may include an insulating material such as, for example, a silicon oxide, or an air gap.

A charge storage layer CS may be provided along exposed surfaces of the insulating films IL, the pillars P, and the substrate SUB in the region between the two adjacent common source lines CSL. The charge storage layer CS may include a gate insulating layer, a charge trap layer, and a blocking insulating layer. The gate insulating layer may also be referred to herein as a tunneling insulating layer. For example, the charge storage layer CS may have an oxide-nitride-oxide (ONO) structure. Further, gate electrodes GE, such as the selection lines GSL and SSL and the word lines WL1 to WL8, may be provided on an exposed surface of the charge storage layer CS in the region between the two adjacent common source lines CSL.

Drains or drain contacts DR may be provided on the plurality of pillars P. For example, the drains or drain contacts DR may include a silicon material in which the silicon material is doped with impurities having the second conductive type. The bit lines BL1 to BL3 may be disposed on the drain contacts DR. The bit lines BL1 to BL3 may extended in a second direction (for example, in a direction of the X-axis) and may be arranged to be spaced apart from each other by a specific distance along the first direction.

Figure 5:
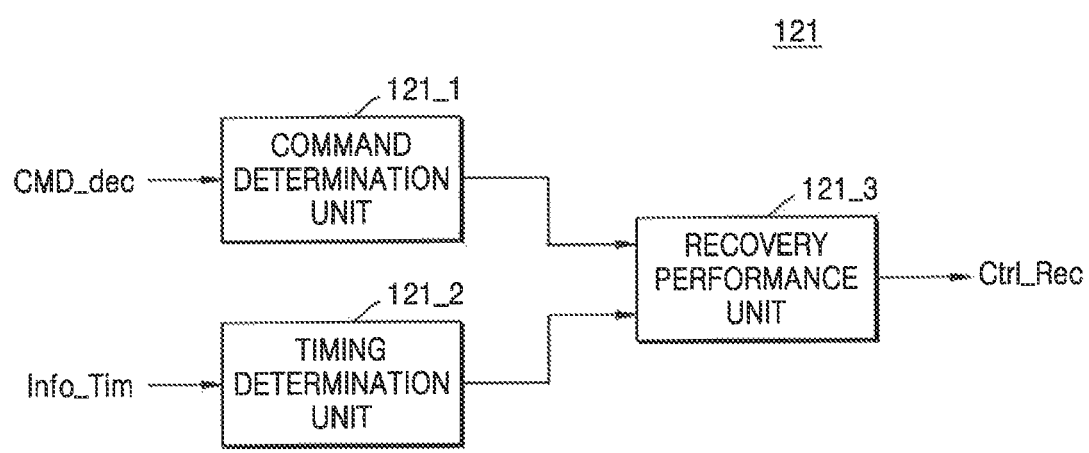
FIG. 5 is a block diagram illustrating an example implementation of a recovery controller shown in the memory device illustrated in FIG. 2 according to an exemplary embodiment of the present inventive concept.

FIG. 5 is a block diagram illustrating an example of an implementation of a recovery controller shown in the memory device shown in FIG. 2, according to an exemplary embodiment of the present inventive concept.

As shown in FIG. 5, the recovery controller 121 may include a command determination unit 121_1, a timing determination unit 121_2, and a recovery performance unit 121_3. The recovery controller 121 may determine whether to delete the recovery period from the memory operation based on the command and/or the address transferred from the memory controller, and control the recovery operation according to the determination result.

Further, the command determination unit 121_1 may determine kinds of commands which are continuously transferred from the memory controller. For example, the command transferred from the memory controller may be decoded in the memory device, and the command determination unit 121_1 may determine the kind of the command by receiving the decoded command CMD_dec. For example, when a first command and a second command are continuously received, the command determination unit 121_1 may determine whether each of the first command and the second command is the read command. When it is determined that both the first command and the second command are the read command, the command determination unit 121_1 may provide the determination result for skipping the recovery operation.

The timing determination unit 121_2 may determine a timing for reception of the second command. For example, when the first command corresponds to the read command, a first memory operation corresponding to the first command may include the setup period, the sensing period, the recovery period, and the dump period. The second command may be received while the first memory operation corresponding to the first command is performed, and the timing determination unit 121_2 may determine whether the second command is received before the sensing period included in the first memory operation is completed according to timing information Info_Tim representing a reception timing of the second command. When it is determined that the second command is received before the sensing period included in the first memory operation is completed, the timing determination unit 121_2 may provide the determination result for skipping the recovery operation.

The recovery performance unit 121_3 may delete the recovery period from the first memory operation based on the determination result of the command determination unit 121_1 and the timing determination unit 121_2, or the recovery operation may be skipped. For example, when the same kind of command (for example, the read command) is continuously received and a next read command is received before the sensing operation according to a current read command is completed, the recovery operation in the memory operation according to the current read command may be skipped. For example, the recovery period may be deleted from the first memory operation. The recovery performance unit 121_3 may provide a recovery control signal Ctrl_Rec for performing the recovery operation to the various kinds of function blocks of the memory device. When the recovery operation is skipped, the recovery control signal Ctrl_Rec may be deactivated.

In the exemplary embodiment of FIG. 5 described above, an example in which the various kinds of determination operations are performed by the recovery controller 121 is described. However, exemplary embodiments of the inventive concept are not limited thereto. For example, a hardware or software configuration for performing a command determination and a timing determination may be included in the control logic 120 illustrated in FIG. 2. Further, the recovery controller 121 may receive the determination result, and control the various kinds of function blocks inside the memory device 100 so that the recovery operation is selectively performed based on the determination result.

Figure 6:
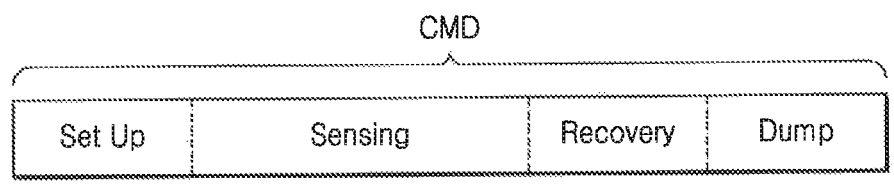
FIGS. 6 and 7 are diagrams illustrating examples of various kinds of periods included in a memory operation according to a read command.
Figure 7:
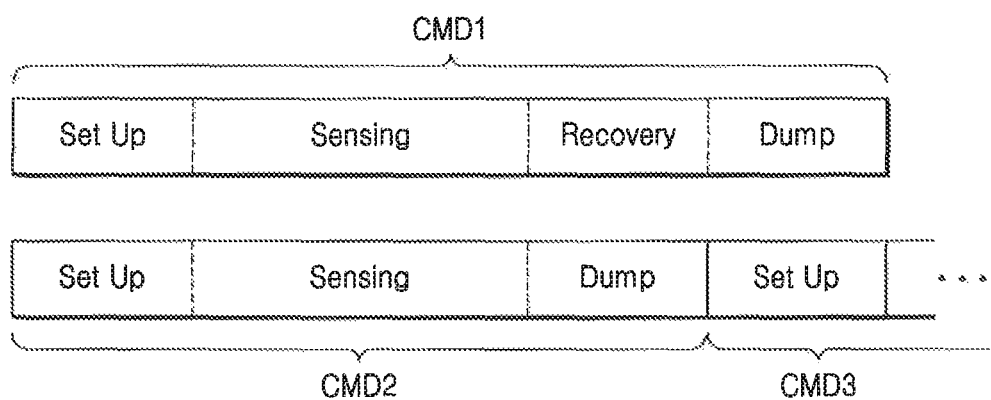

FIGS. 6 and 7 are diagrams illustrating an example of various kinds of periods included in a memory operation according to a read command according to exemplary embodiments of the present inventive concept.

FIG. 6 illustrates an example in which the recovery period is included in the memory operation. When the read command CMD is input to the memory device, the memory device may sequentially perform the setup period, the sensing period, the recovery period, and the dump period in response to the read command CMD. As a modifiable example, a sequence of the recovery period and the dump period in the memory operation may be changed.

FIG. 7 illustrates an example in which the recovery period is selectively deleted in the memory operation according to exemplary embodiments of the present inventive concept. For example, various kinds of determination operations may be performed using the second read command CMD2 and; or the address provided together with the second read command CMD2, and the recovery period may be selectively deleted from the first memory operation on the first read command CMD1 according to the determination result. As an example, as the recovery period is not deleted, the setup period, the sensing period, the recovery period, and the dump period included in the first memory operation may be sequentially performed. Alternatively, the recovery period may be deleted from the second memory operation on the second read command CMD2 according to the various kinds of determination operations using a third command CMD3 and/or an address provided together with the third command CMD3. For example, as the recovery period is deleted, the setup period, the sensing period, and the dump period included in the second memory operation may be sequentially performed, and the recovery operation may not be performed.

Figure 8:
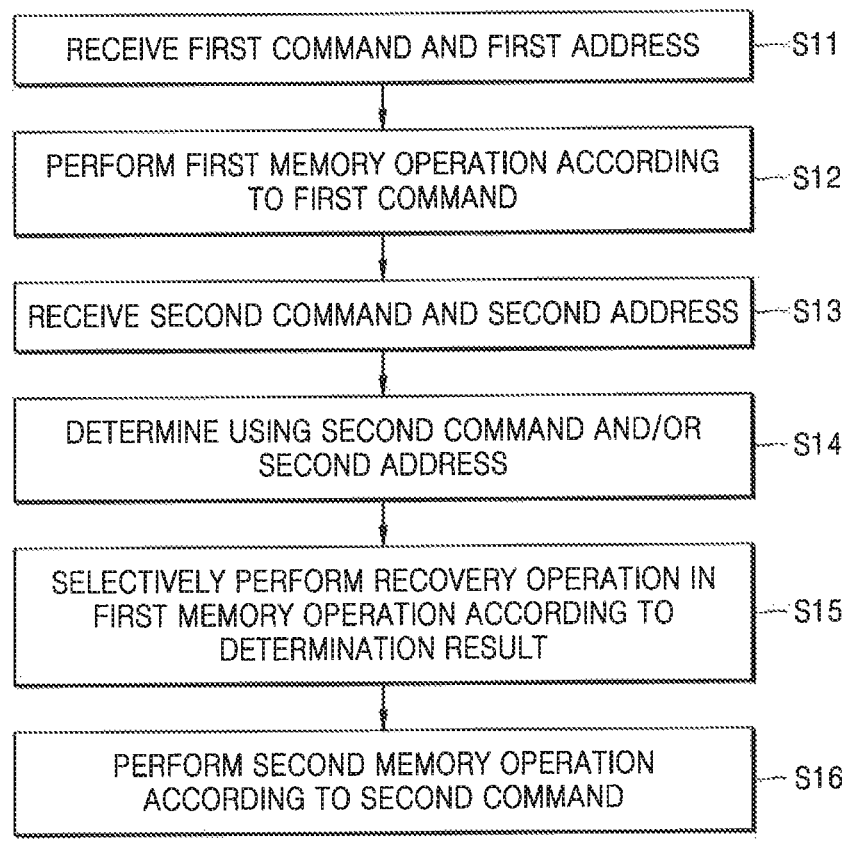
FIGS. 8 and 9 are flowcharts for describing a method of operating a memory device according to an exemplary embodiment of the present inventive concept.
Figure 9:
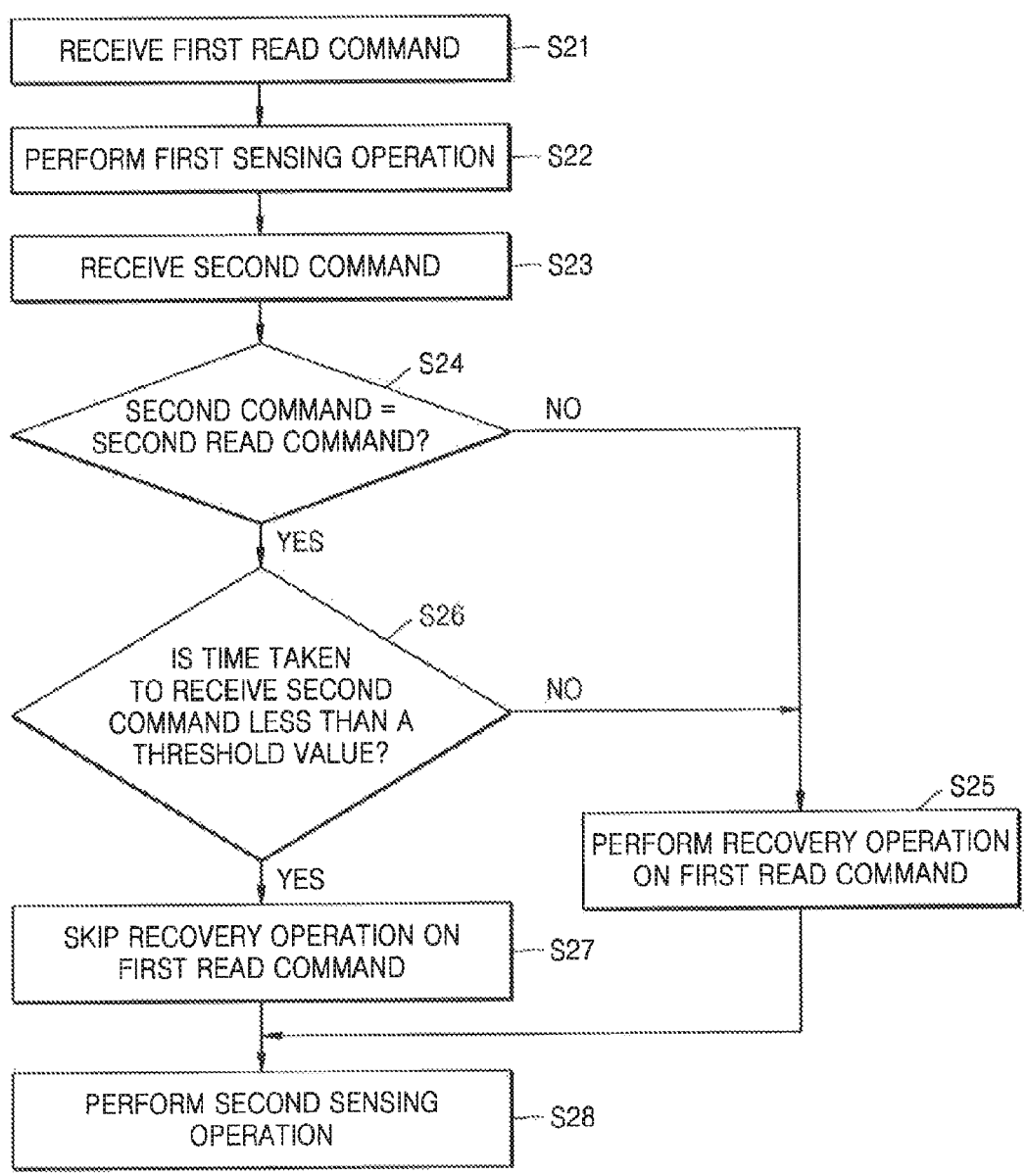

FIGS. 8 and 9 are flowcharts for describing a method of operating a memory device according to exemplary embodiments of the present inventive concept.

Referring to FIG. 8, a plurality of commands may be continuously provided to the memory device for the write operation, the read operation, etc. The memory device may receive a first command and a first address (S11), and perform a first memory operation according to the first command (S12). For example, the first memory operation may include a plurality of periods for the write operation, the read operation, etc., as disclosed with reference to the exemplary embodiments of the present inventive concept described above.

Subsequently, a second command and a second address provided together with the second command may be received (S13), and a determination operation may be performed using at least one of the second command and the second address (S14). According to the exemplary embodiment of the present inventive concept described above, one or more various determination operations may be performed, and the recovery operation in the first memory operation may be selectively performed according to the determination result (S15). When the recovery operation is skipped according to the determination result, the first memory operation may be completed without performing the recovery operation. Subsequently, the second memory operation may be performed according to the second command (S16).

PG. 9 illustrates an example in which the recovery period is skipped according to an exemplary embodiment of the present inventive concept. Referring to FIG. 9, the memory device may receive the first read command (S21), and perform a first sensing operation in response to the first read command (S22). Further, the memory device may receive a second command which is continuously provided after the first read command (S23).

To determine whether to perform the recovery operation, it may be determined whether the second command corresponds to the second read command requesting the read operation (S24). When the second command does not correspond to the second read command according to the determination result, the recovery operation in the first memory operation corresponding to the first read command may be performed (S25).

Alternatively, when the second command corresponds to the second read command, a reception timing of the second command may be compared to a threshold value (also referred to as a threshold timing) (S26). For example, the amount of time taken to receive the second command may be compared to a threshold value. The threshold value may be variously set. For example, the threshold value may correspond to a completion timing of the first sensing period included in the first memory operation performed in response to a current read command (for example, the first read command). That is, the threshold value may be set to correspond to the amount of time taken to complete the first sensing period. When the amount of time taken to receive the second command is greater than the threshold value, the recovery operation in the first memory operation corresponding to the first read command may be performed (S25).

Alternatively, when the amount of time taken to receive the second command is less than the threshold value, the recovery operation in the first memory operation corresponding to the first read command may be skipped (S27). That is, the first memory operation on the first read command may be completed without performing the recovery operation. Subsequently, the second sensing operation corresponding to the second read command may be performed (S28).

In an exemplary embodiment of the present inventive concept similar to FIG. 9, the method of operating a nonvolatile memory device may include receiving a first read command, performing a first sensing operation in response to the first read command, and receiving a second command. The method may further include determining whether the second command is a second read command, and performing a recovery operation in a first memory operation corresponding to the first read command when the second command is not the second read command. The method may further include skipping the recovery operation in the first memory operation corresponding to the first read command when the second command is the second read command and when the second read command is received before the first sensing operation is completed, and performing second sensing operation in response to the second read command.

In an exemplary embodiment of the present inventive concept, the method may further include comparing an amount of time taken to receive the second command to a threshold value when the second command is the second read command. The method may also include performing the recovery operation in the first memory operation corresponding to the first read command when the amount of time taken to receive the second command is greater than the threshold value.

In an exemplary embodiment of the present inventive concept, the method may further include performing the first memory operation corresponding to the first read command without performing the recovery operation when the amount of time taken to receive the second command is less than the threshold value.

In an exemplary embodiment of the present inventive concept, the second read command is continuously provided after the first read command.

In an exemplary embodiment of the present inventive concept, the threshold value corresponds to an amount of time taken to complete a first sensing period included in the first memory operation.

FIG. 10 is a table illustrating an example of when the recovery operation is skipped at various conditions according to exemplary embodiments of the present inventive concept. In this example, a current or voltage bias applied to various kinds of lines (for example, the word line and the bit line) of the memory device in the recovery period is initialized (or discharged), or outputs (for example, outputs of pumps) of various kinds of voltage generators generating a bias voltage are initialized, are illustrated.

According to an exemplary embodiment of the present inventive concept, the recovery period may be deleted based on the various kinds of determination results described above. For example, it may be determined whether it is necessary to perform the recovery operation by determining the kind of the command and the reception timing, and when it is determined that it is not necessary to perform the recovery operation, the recovery period may be deleted.

When the recovery period is deleted, the bias applied to the word line WL and the bias applied to the bit line BL may not be discharged, and may be maintained in a current state even when the sensing operation for the read operation is completed. Further, the output of the pump providing the bias for the read operation may not be initialized, and may be maintained in the current state.

According to an exemplary embodiment of the present inventive concept, even when it is determined that it is not necessary to perform the recovery operation, the recovery period may be maintained, and the recovery operation may be skipped on only some of components. For example, in the recovery period, as the recovery operation is skipped on only the bit line BL and the pump but is performed on the word line WL, the voltage bias applied to the word line WL may be discharged.

As another example, in the recovery period, as the recovery operation is skipped on only some of the pumps and the bit line BL but is performed on the word line WL, the voltage bias applied to the word line WL may be discharged. Further, the outputs of some of the pumps providing the bias to the word line WL may be initialized.

As another example, in the recovery period, as the recovery operation is skipped on only the word line WL and the pump but is performed on the bit line BL, the voltage bias applied to the word line WL may be discharged.

As another example, in the recovery period, as the recovery operation is skipped on only some of the pumps and the word line WL but is performed on the bit line BL, the voltage bias applied to the bit line BL may be discharged. Further, the outputs of some of the pumps providing the bias to the bit line BL may be initialized.

The recovery operation shown in FIG. 10 is merely one example which is applicable to the exemplary embodiments of the present inventive concept, and the exemplary embodiments of the present inventive concept may be variably modified. For example, the initialization operation may be performed on various other components in the recovery period, the recovery period may be deleted according to determination results according to the exemplary embodiments of the present inventive concept, or may be selectively skipped on various components.

Figure 11:
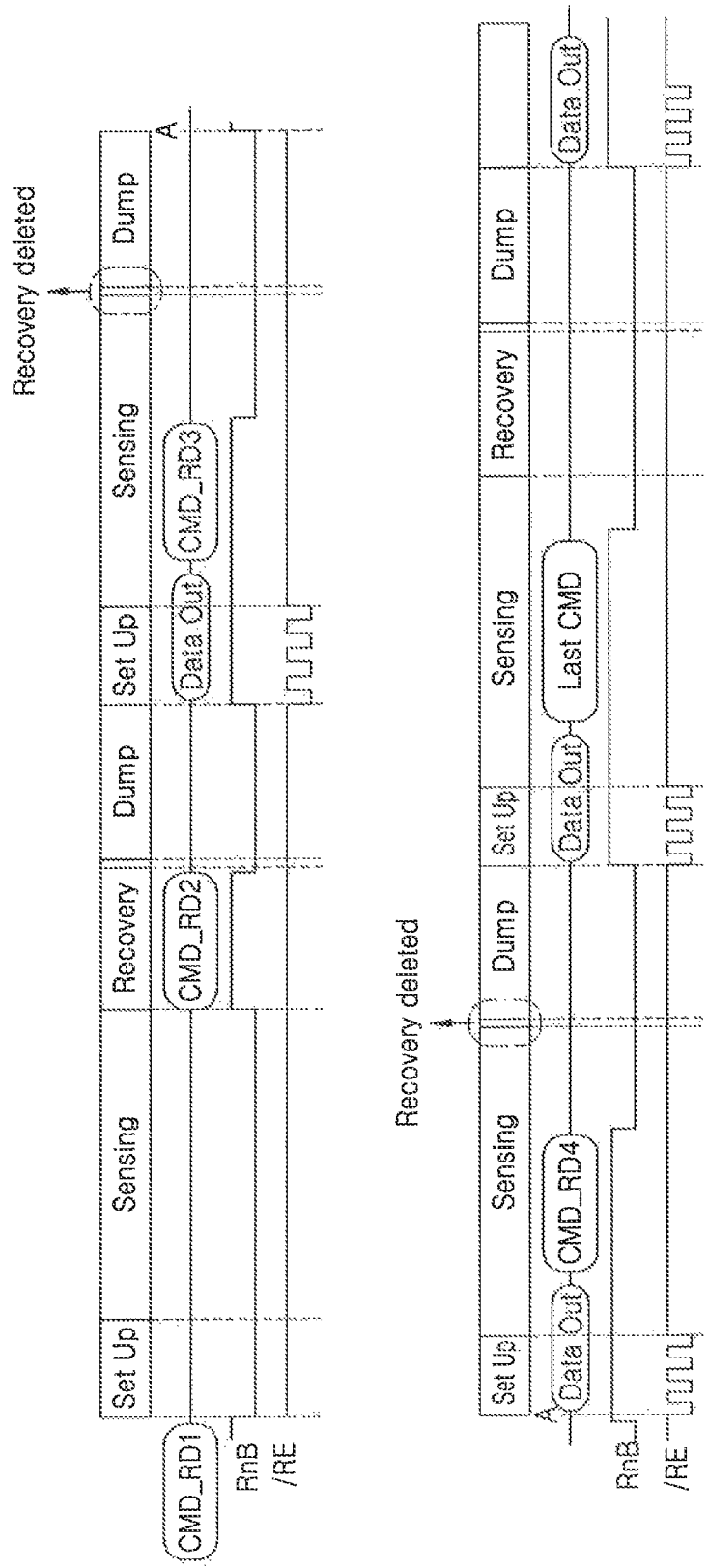
FIGS. 11 and 12 are timing diagrams illustrating various kinds of operation periods of a memory device according to an exemplary embodiments of the present inventive concept.
Figure 12:
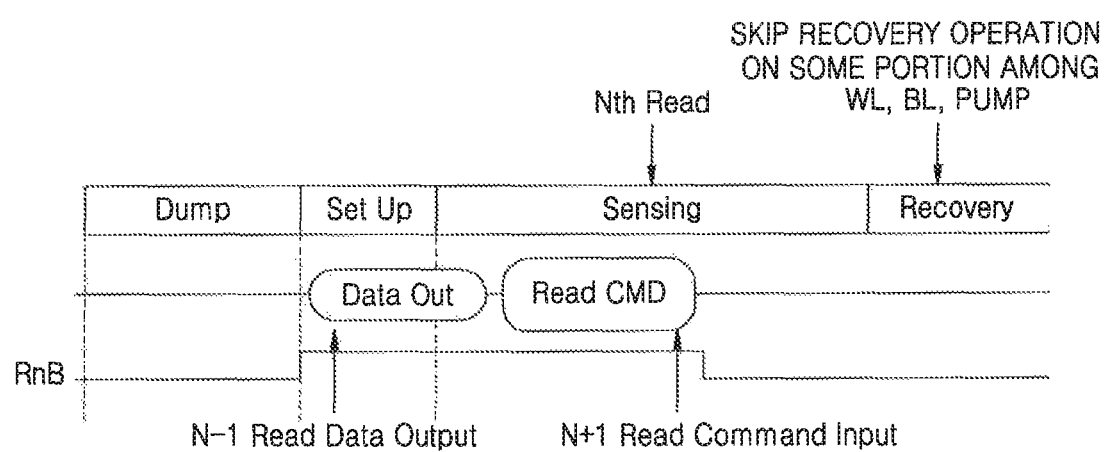

FIGS. 11 and 12 are timing diagrams illustrating various kinds of periods of operation of a memory device according to an exemplary embodiment of the present inventive concept.

Referring to FIG. 11, as a first read command CMD_RD1 is received, a first memory operation may be performed. For example, in the first memory operation, the setup operation, the sensing operation (e.g., the read operation), the recovery operation, and the dump operation may be sequentially performed. As the first read command CMD_RD1 is received, the ready/busy signal RnB may be transitioned to the low level L, and as the read operation is completed, the ready/busy signal RnB may be transitioned to the high level H. While the ready/busy signal RnB is at the high level H, a second read command CMD_RD2 may be received. Further, as the second read command CMD_RD2 is received, the ready/busy signal RnB may be transitioned to the low level L, and as the dump operation is completed, the ready/busy signal RnB may be again transitioned to the high level H. Since the second read command CMD_RD2 is received after the sensing operation (e.g., the read operation) according to the first read command CMD_RD1 is completed (or, is received while the recovery operation is performed), the recovery operation in the first memory operation may not be skipped.

The second memory operation may be performed in response to the second read command CMD_RD2. Since data Data read in response to the first read command CMD_RD1 is moved from the page buffer to the input and output buffer through the dump operation, the data Data stored in the input and output buffer may be provided to the memory controller while the second memory operation is performed. For example, as the data request signal /RE is activated, the data Data may be provided from the memory device to the memory controller (Data Out).

Similarly, a third read command CMD_RD3 may be received while the second memory operation is performed in response to the second read command CM_RD2. When the third read command CMD_RD3 is received, an operation of determining the kind of the third read command CMD_RD3, an operation of determining the reception timing of the third read command CMD_RD3, an operation of determining the address provided together with the third read command CMD_RD3, etc., may be performed. Since the third read command CMD_RD3 is received before the read operation according to the second read command CMD_RD2 is completed (or, is received before the recovery operation is performed), the recovery operation in the second memory operation may be skipped or the recovery period may be deleted).

Similarly, while a third memory operation is performed in response to the third read command CMD_R3, a fourth read command CMD_RD4 may be received, and the recovery operation in the third memory operation may be skipped according to the various kinds of determination results. Supposing, for example, that the fourth read command CMD_RD4 is a last command in the continuous read operations, a command Last CMD representing that a corresponding read operation is a last read operation may be received while a fourth memory operation is performed according to the fourth read command CMD_RD4. According to an exemplary embodiment of the present inventive concept, when the command Last CMD is received, the recovery operation in the fourth memory operation may not be skipped.

The operation of an exemplary embodiment of the present inventive concept shown in FIG. 11 is merely one example, and a sequence of the recovery operation and the dump operation may be changed according to an exemplary embodiment of the present inventive concept. In this example, a criterion of determining whether to perform the recovery operation may also be changed. For example, regarding the second and third read commands CMD and CMD_RD3, when the third read command CMD_RD3 is received before the recovery operation of the second read command CMD_RD2 is performed, the recovery operation in the second memory operation may be skipped. In this example, even when the third read command CMD_RD3 is received after the read operation according to the second read command CMD_RD2 is completed, the recovery operation may be skipped when the third read command CMD_RD3 is received before the dump operation is completed.

In addition, FIG. 12 illustrates an example of skipping the recovery operation without deleting an entire recovery period in the memory operation. As illustrated in FIG. 12, as a next read command (for example, an NH+1_th read command) is received while a prior read operation (N-th read operation) according to a prior read command (N-th read command) is performed, the recovery operation in a prior memory operation (N-th memory operation) may be skipped. In this case, the recovery operation may be skipped on only sonic of the components (e.g., word line WL, bit line BL, pump Pump) without deleting the recovery period.

When the recovery operation includes the initialization operation on the word line, the bit line, and the pump, the recovery operation may be selectively skipped on only some of the components in the recovery period. As an example, while a voltage bias discharge operation on the word line is skipped in the N-th memory operation, the recovery operation on remaining components, such as the bit line, the pump, etc., may be performed. The components in which the recovery operation is skipped may be selected in various manners.

Figure 13:
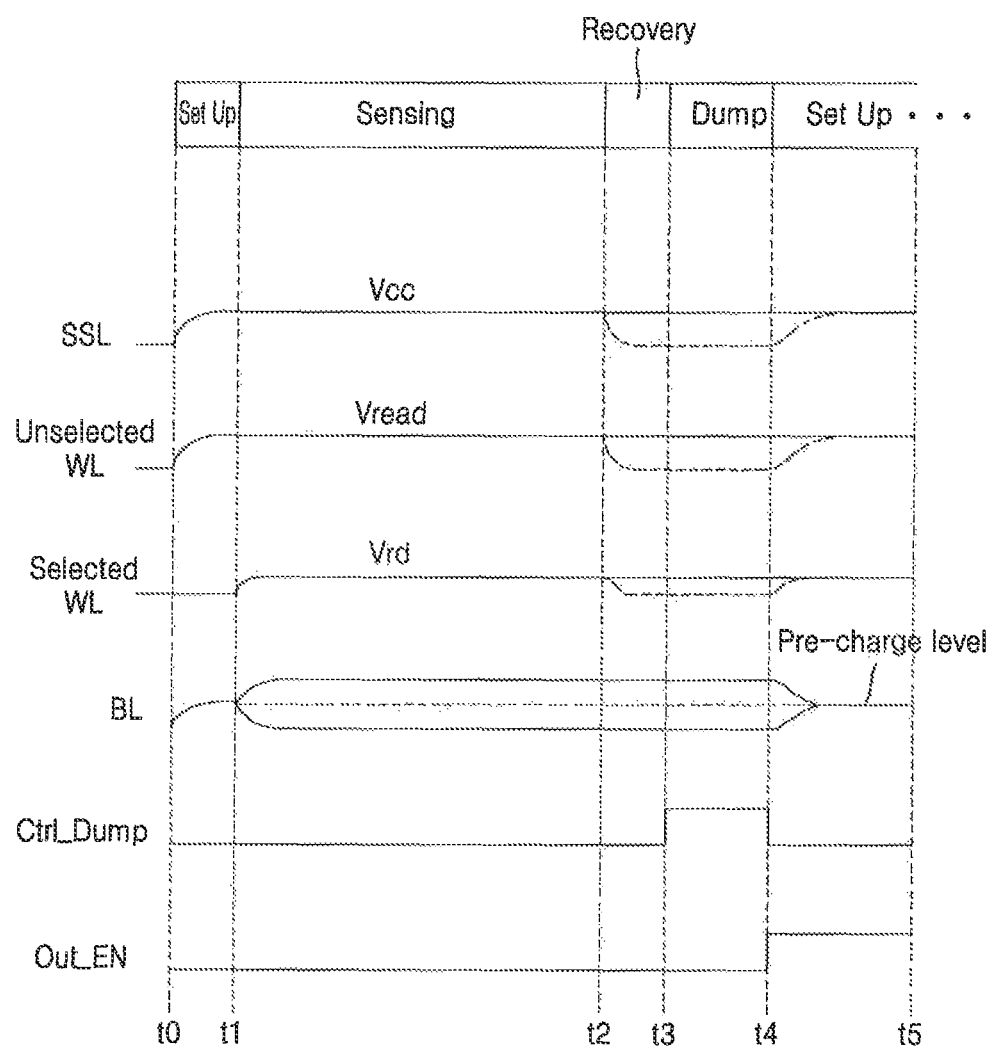
FIG. 13 is a waveform diagram illustrating an example operation of a memory device according to an exemplary embodiment of the present inventive concept.

FIG. 13 is a waveform diagram illustrating an example of operation of a memory device according to exemplary embodiments of the present inventive concept. For example, FIG. 13 illustrates a waveform diagram of various kinds of voltage levels of a case in which the recovery period is deleted and a case in which the recovery period is not deleted, in the read operation on the memory device.

In the memory operation on any one read command, as the setup period t0 to t1 is performed, voltage levels of the string selection line SSL, the unselected word line Unsel WL, the bit line BL, etc., may be increased. In an example of FIG. 13, a voltage level Vrd of a selected word line Sel WL is increased in the sensing period t1 to t2 as the voltage level Vrd of the selected word line Sel WL is smaller than a voltage level Vread of the unselected word line Unsel WL. However, exemplary embodiments of the present inventive concept are not limited thereto. For example, the voltage level Vrd of the selected word line Sel WL may be increased in the setup period.

In the sensing period t1 to t2, the voltage level of the bit line BL may be gradually increased or decreased from a precharge level according to data stored in the memory cell. The data may be sensed in a state in which the voltage level of the bit line BL is developed, and the sensed data may be stored in the page buffer included in the memory device. After the storing of the sensed data, when the recovery operation is performed in the recovery period t2 to t3, a signal waveform is changed as shown in a dotted line. Alternatively, when the recovery period t2 to t3 is deleted, in the waveform shown in FIG. 13, the dump period t3 to t4 may be performed without performing the recovery operation after the sensing period t1 to t2.

For example, when the recovery period t2 to t3 is deleted, the voltage levels of the string selection line SSL, the selected word line Sel WL, and the unselected word line Unsel WL may be maintained in states of a previous period, whereas when the recovery operation is performed in the recovery period t2 to t3, the voltage levels of the string selection line SSL, the selected word line Sel WL, and the unselected word line Unsel WL may be changed into the initialization state, such as a ground voltage level, etc. Subsequently, as the dump period t3 to t4 is performed, the data stored in the page buffer may be transferred to the input and output buffer, and the setup period to the dump period may be sequentially performed in response to the next read command.

As another example, substantially similar to the exemplary embodiments of the present inventive concept described above, even when it is determined that the recovery operation is skipped according to the various kinds of determination results, the recovery period t2 to t3 may be included in the memory operation. In this example, during the recovery period t2 to t3, while the recovery operation on some of the components is skipped, the recovery operation on remaining components may be performed.

Figure 14:
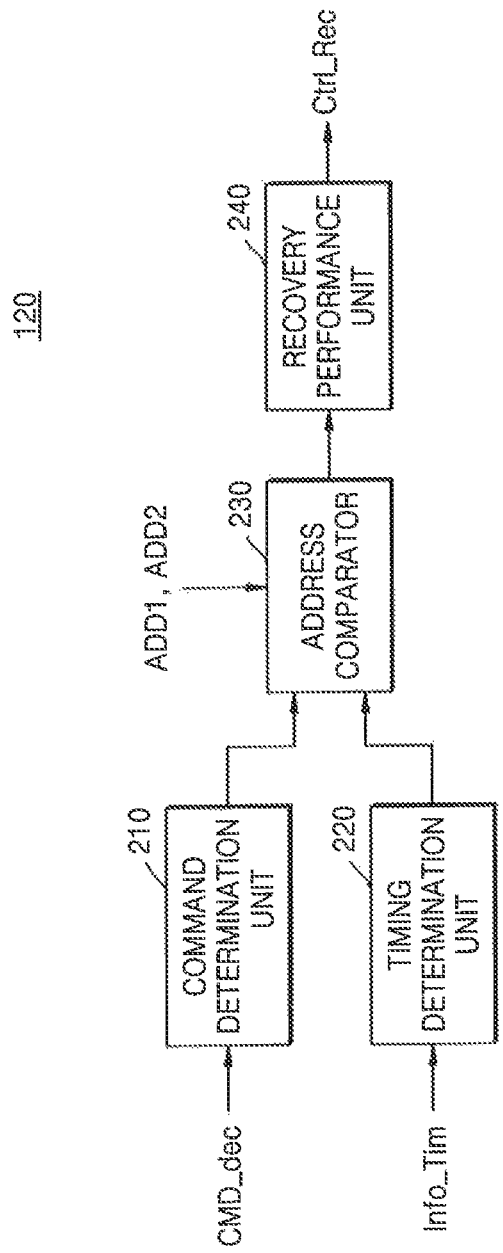
FIG. 14 is a block diagram illustrating an example implementation of a control logic included in a memory device according to an exemplary embodiment of the present inventive concept.

FIG. 14 is a block diagram illustrating an example implementation of a control logic included in a memory device according to an exemplary embodiment of the present inventive concept. For convenience of explanation, when describing operations of the components illustrated in FIG. 14, a further description of operations of components previously described may be omitted.

As shown in FIG. 14, the control logic 120 may include a command determination unit 210, a timing determination unit 220, an address comparator 230, and a recovery performance unit 240. The control logic 120 may determine whether to delete the recovery period in the memory operation based on the command and/or the address transferred from the memory controller, and control the recovery operation according to the determination result.

The command determination unit 210 may determine whether the command transferred from the memory controller is the read command by determining a decoded command CMD_dec. The timing determination unit 220 may determine whether the command transferred from the memory controller is received before the sensing period of a current memory operation is completed. As an example, when the first and the second read commands are continuously received and the second read command is received before the sensing period included in the first memory operation is completed, the determination result for deleting the recovery period may be provided to the address comparator 230.

The address comparator 230 may compare a first address ADD1 provided together with the first read command and a second address ADD2 provided together with the second read command. As an example, the address comparator 230 may compare whether the first address ADD1 and the second address ADD2 are the same. Further, the first address ADD1 may include a first row address and a first column address, and the second address ADD2 may include a second row address and a second column address. As an example, the address comparator 230 may compare whether the first row address and the second row address are the same and whether the first column address and the second column address are the same.

According to an exemplary embodiment of the present inventive concept, the recovery period may be deleted or performed in various manners according to the address comparison result. For example, in a state of satisfying the condition described above (the case in which the second read command is received before the sensing period included in the first memory operation is completed), the recovery period may be deleted or the recovery operation may be performed according to the comparison result of the first address ADD1 and the second address ADD2. Thus, in this case, after the satisfying condition is determined by the timing determination unit 220, the address comparator 230 may generate a subsequent result to determine whether the recovery period may be deleted or performed.

As an example of one operation, when the word line (or the page) selected in the first memory operation and the word line (or the page) selected in the second memory operation are the same, the recovery period may be deleted from the first memory operation. For example, when the same word line is selected in the first and second memory operations, the voltage bias of the string selection line SSL, the selected word line Sel WL, and the unselected word line Unsel WL in the first memory operation, and the voltage bias of the lines in the second memory operation may be substantially the same. Referring to the waveform diagram illustrated in. FIG. 13 the voltage levels of the string selection line SSL, the selected word line Sel WL, and the unselected word line Unsel WL after the sensing period t1 to t2 included in the first memory operation are substantially similar to the voltage levels of the lines when the setup period t4 to t5 included in the second memory operation is completed, and thus the recovery period may be deleted from the first memory operation.

Alternatively, when the first row address and the second row address are different from each other, the voltage bias of the selected word line Sel WL and the unselected word line Unsel WL may be changed in the first and second memory operations, and thus the recovery operation may be performed after the sensing period t1 to t2 is completed in the first memory operation.

In addition, with respect to the bit line, the voltage level of the bit line selected in the first memory operation may be developed through the sensing operation. Thus the voltage of the bit line in which the sensing operation is performed may be changed from the precharge level to the logic high (or, the logic low) level. According to an exemplary embodiment of the present inventive concept, the recovery period may be deleted or the recovery operation may be performed according to whether the bit lines selected in response to the first column address and the bit lines selected in response to the second column address are the same. For example, when the first column address and the second column address are different from each other, the recovery period may be deleted.

Figure 15:
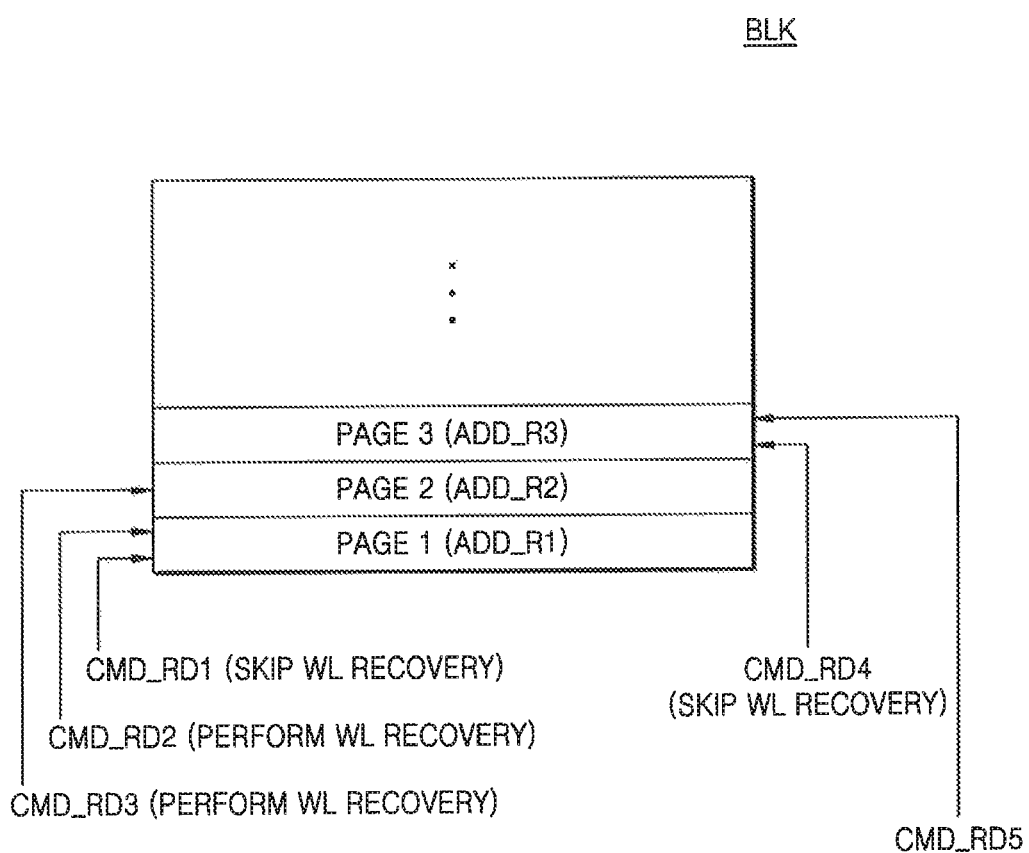
FIGS. 15 and 16 are block diagrams illustrating an example of a recovery operation of the memory device illustrated in FIG. 14 according to an exemplary embodiment of the present inventive concept.
Figure 16:
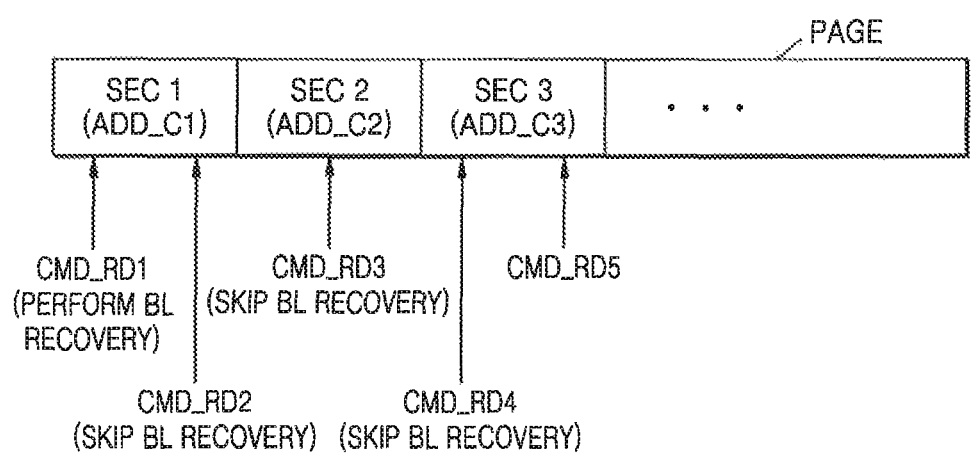

An example of an operation of the memory device according to an exemplary embodiment of the present inventive concept described above will be described with reference to FIGS. 15 and 16. FIGS. 15 and 16 are block diagrams illustrating an example of a recovery operation of the memory device shown in FIG. 14 according to an exemplary embodiment of the present inventive concept.

Referring to FIG. 15, any one of the plurality of blocks BLK included in a memory cell array may include a plurality of pages, and each page may be indicated by the row address. Suppose that a first read command CMD_RD1 to a fifth read command CMD_RD5 are continuously input to the memory device. Further, suppose that the reception timing of each of the first read command CMD_RD1 to the fifth read command CMD_RD5 satisfies the condition of the exemplary embodiments of the inventive concept described above. For example, a condition where the read command is received before the sensing period is completed.

When the row address of the first read command CMD_RD1 has a first value ADD_R1, data of at least a portion of a first page PAGE 1 may be read according to the first read command CMD_RD1. After this, when the row addresses related to the first and second read commands CMD_RD1 and CMD_RD2 are the same, the recovery operation on the word line may be skipped after the sensing operation corresponding to the first read command CMD_RD1 is completed, since the second read command CMD_RD2 has the first value ADD_R1.

Alternatively, as the row address related to the third read command CMD_RD3 has a second value ADD_R2, the row addresses related to the second and third read commands CMD_RD2 and CMD_RD3 may be different from one another. Accordingly, as the recovery operation on the word line is performed after the sensing operation corresponding to the second read command CMD_RD2 is completed, the word line may be initialized.

In addition, an operation on the next read commands may be performed like the method described above. For example, as the row address related to the fourth read command CMD_RD4 has a third value ADD_R3, the row addresses related to the third and fourth read commands CMD_RD3 and CMD_RD4 may be different from one another. Accordingly, the recovery operation on the word line may be performed after the sensing operation corresponding to the third read command CMD_RD3 is completed. Alternatively, as the row address of the fifth read command CMD_RD5 has the third value ADD_R3, the row addresses related to the fourth and fifth read commands CMD_RD4 and CMD_RD5 may be the same. Accordingly, the recovery operation on the word line may be skipped after the sensing operation corresponding to the fourth read command CMD_RD4 is completed.

In the exemplary embodiment of the present inventive concept illustrated in FIG. 15, whether to skip or perform the recovery operation on the word line has been described. Similar to the exemplary embodiment described above, the recovery operation on the bit line or the pump output may be performed together. Further, the recovery period may be deleted from the memory operation according to the address comparison result, or the recovery period may be included but the recovery operation may be skipped on only some of the components.

In addition, referring to FIG. 16, whether to skip the recovery operation may be determined based on the comparison result of the column addresses. Referring to FIG. 16, an example will be described in which, when the column address of the current read command and the column address of the next read command are different from each other, the operation of the recovery period included in the current memory operation is skipped.

Each page PAGE may include a plurality of cell regions, and for example, the page PAGE may include a plurality of sectors SEC. The cell regions described above may be variously defined, and for example, the memory cells connected to the same word line may be defined as one page PAGE. Further, a write/read unit of the memory device may have a size corresponding to a portion of the page PAGE, and the sector SEC may correspond to the write/read unit of the memory device. Alternatively, the sector SEC may correspond to an error correction and detection unit of the memory device.

The first to fifth read commands CMD_RD1 to CMD_RD5 may be continuously provided to the memory device, and a portion of the address related to each read command may be a column address specifying a column of the memory cells. As an example, any one sector SEC of the page PAGE may be selected according to the column address related to each read command.

Since the column address of the first read command CMD_RD1 has a first value ADD_C1 specifying a first sector SEC1, data of the first sector SEC1 may be read. In addition, since the column address of the second read command CMD_RD2 has the first value ADD_C1 specifying the first sector SEC1, the column addresses of the first read command CMD_RD1 and the second read command CMD_RD2 may be the same. Accordingly, the recovery operation on the bit line may be performed after the sensing operation corresponding to the first read command CMD_RD1 is completed.

Alternatively, since the column address of the third read command CMD_RD3 has a second value ADD_C2 specifying a second sector SEC2, the column addresses of the second read command CMD_RD2 and the third read command CMD_RD3 may be different from each other. Accordingly, the recovery operation on the bit line may be skipped after the sensing operation corresponding to the second read command CMD_RD2 is completed. According to the operation described above, the recovery operation on the bit line may be skipped after the sensing operation corresponding to the third read command CMD_RD3 is completed based on the comparison result of the column addresses, and the recovery operation on the bit line may be performed after the sensing operation corresponding to the fourth read command CMD_RD4 is completed.

In the exemplary embodiment of the present inventive concept illustrated in FIG. 16, whether to skip or perform the recovery operation on the bit line has been described. Similar to the exemplary embodiment of the present inventive concept described above, the recovery operation on the word line or the pump output may be performed together.

Figure 17:
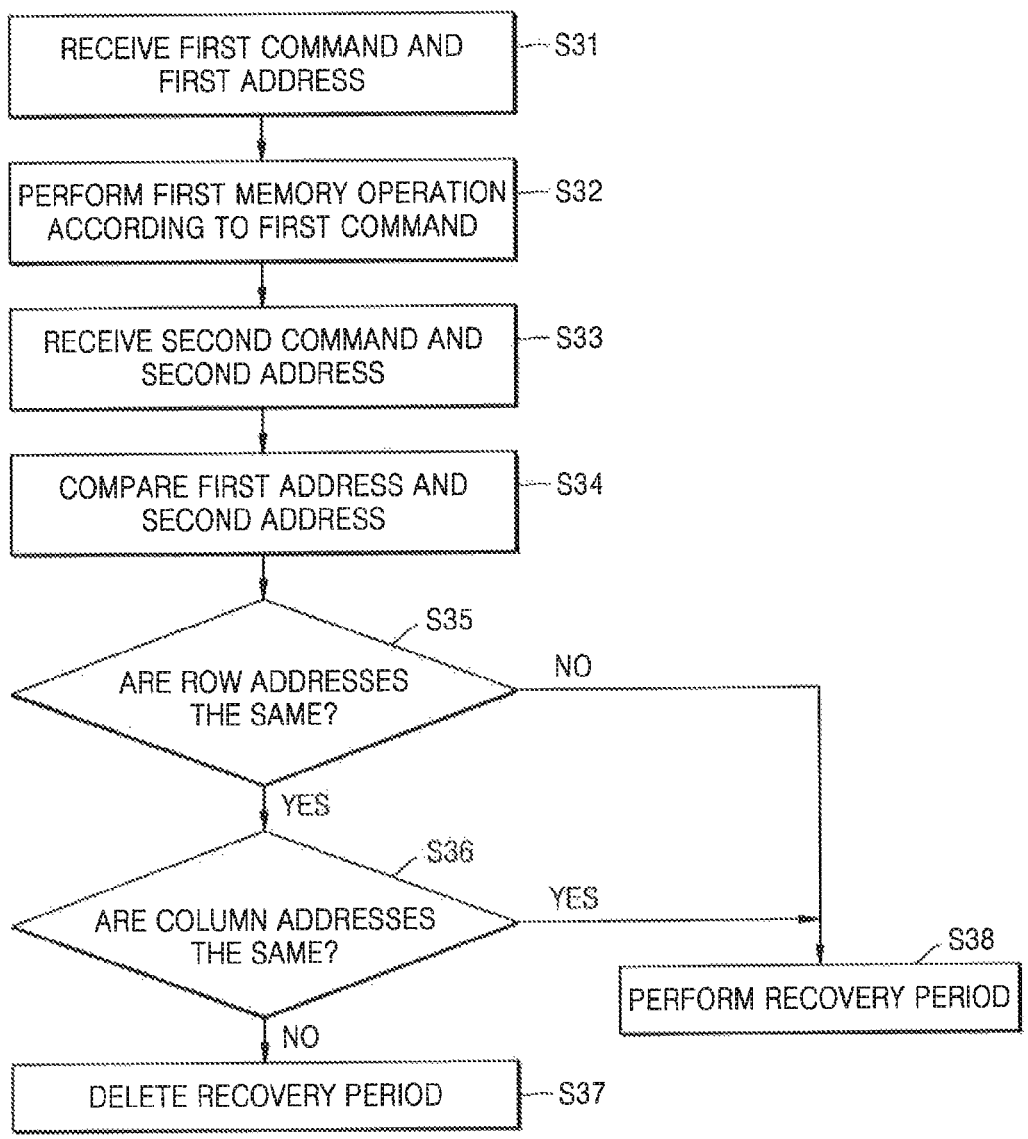
FIG. 17 is a flowchart illustrating an example operation of the memory device illustrated in FIG. 14 according to an exemplary embodiment of the present inventive concept.

FIG. 17 is a flowchart illustrating an example of an operation of the memory device illustrated in FIG. 14 according to an exemplary embodiment of the present inventive concept.

Referring to FIG. 17, the memory device may receive the first command and the first address (S31), and perform the first memory operation according to the first command (S32). For example, the read operation on the memory cells specified by the first address may be performed.

While the first memory operation is performed, the memory device may receive the second command and the second address (S33), and compare the first address and the second address to determine whether to delete the recovery period (S34). When each of the first address and the second address includes the row address and the column address, the row addresses of the first command and the second command may be compared with each other, and the column addresses of the first command and the second command may be compared with each other.

According to the comparison result, whether the row addresses of the first address and the second address are matched may be determined (S35). If the row addresses of the first address and the second address are different front each other according to the determination result, the recovery operation may be performed in the first memory operation (S38). Alternatively, if the row addresses of the first address and the second address are the same, the result of the comparison between the column addresses may be determined.

Whether the column addresses of the first address and the second address are the same may be determined (S36), and if the column addresses of the first address and the second address are the same according to the determination result, the recovery operation may be performed in the first memory operation (S38). Alternatively, when the column addresses of the first address and the second address are different from each other according to the determination result, the recovery period may be deleted from the first memory operation (S37).

In the exemplary embodiment of the present inventive concept illustrated in FIG. 17, an example in which the matching results of both the row addresses and the column addresses are used is illustrated. However, exemplary embodiments of the present inventive concept are not limited thereto. For example, similar to the exemplary embodiments of the present inventive concept described above, when determining whether to delete the recovery period, only the matching result of the row addresses may be used, or only the comparison result of the column addresses may be used.

Figure 18:
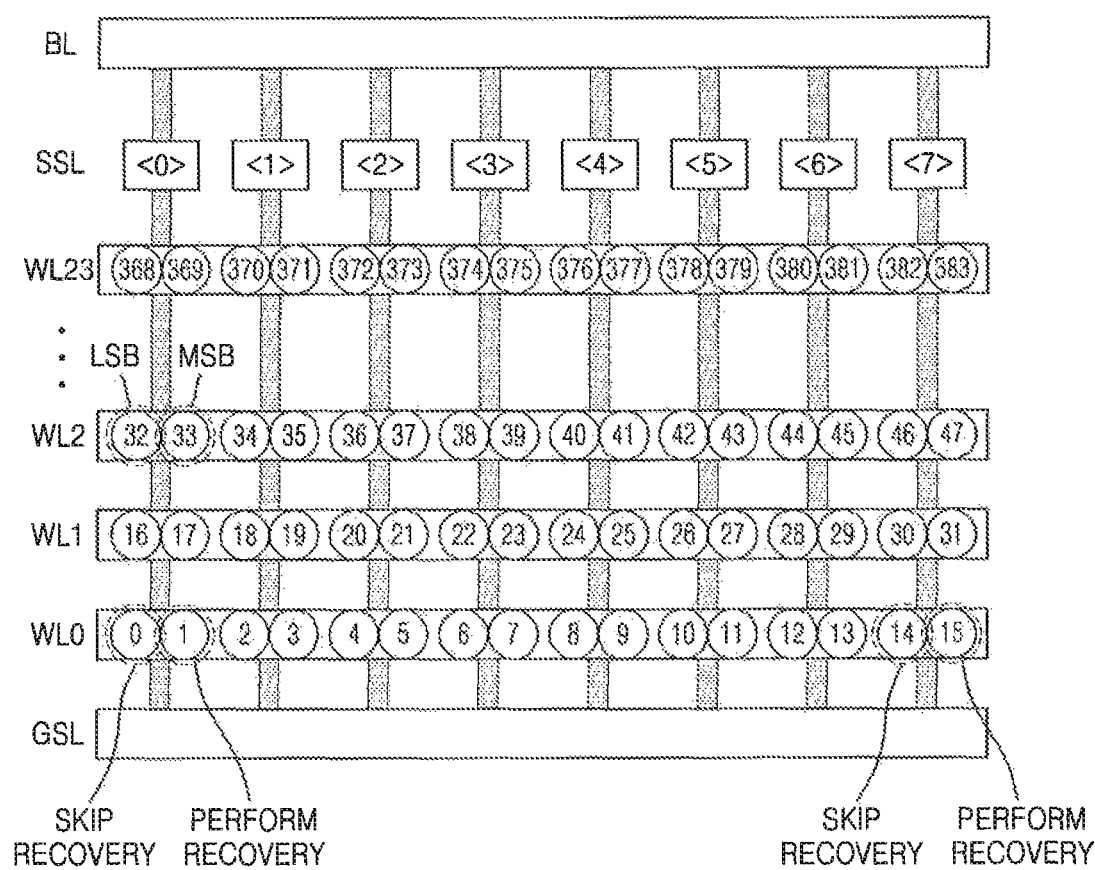
FIG. 18 is a diagram illustrating an example in which an exemplary embodiment of the present inventive concept is applied to a memory device including a multilevel cell.

FIG. 18 is a diagram illustrating an example in which an exemplary embodiment of the present inventive concept is applied to a memory device including a multilevel cell. In FIG. 18, a vertical NAND (VNAND) memory including memory cells of a memory device 300 arranged into a three-dimensional (3D) structure is illustrated. In FIG. 18, for convenience of explanation, an arrangement of the memory cells included in the VNAND memory is simply illustrated. However, the actual components which can be included in the memory device 300 may be referenced from the VNAND memory described with reference to FIGS. 3 to 5.

According to an exemplary embodiment of the present inventive concept, when determining whether to delete the recovery period from the memory operation, it may be determined whether data of the most significant bit MSB of the memory cell corresponding to the multilevel cell is read in the memory operation, or data of the least significant bit LSB of the memory cell corresponding to the multilevel cell is read in the memory operation. Further, the memory device 300 may include a plurality of string selection lines <0> to <7>, and whether the string selection line SSL is changed in the current memory operation and the next memory operation may be determined. According to the various kinds of determination results described above, the recovery period may be deleted in various manners, or the recovery operation on various kinds of components may be skipped.

Referring to FIG. 18, any one page may be selected through the selection operation on the string selection line SSL and the word lines WL0 to WL23. For example, as any one string selection line SSL is selected, the plurality of cell strings connected to the string selection line SSL may be selected. Further, as any one of the word lines among the plurality of word lines WL0 to WL23 is selected, the plurality of memory cells arranged at the same height in the selected plurality of cell strings may be selected. The selected memory cells may form one page.

In FIG. 18, a configuration shown numerically represents one page. For example, the memory cells connected to the first string selection line <0> and the first word line WL0 may store data corresponding to first and second pages 0 and 1. Supposing that the first to eighth string selection lines <0> to <7> are included, the memory cells connected to the first word line WL0 may store data corresponding to the first to sixteenth pages 0 to 15. Similarly, the memory cells connected to the second word line WL1 may store data corresponding to seventeenth to thirty-second pages 16 to 31. Further, supposing that two-bit data is stored in one memory cell, the data stored in any one memory cell may include data of the MSB and data of the LSB.

An operation related to the recovery of the memory device 300 will be described below. Supposing that the reception timing of the read commands, which are continuously received, satisfies a deletion condition of the recovery period, the recovery period may be deleted from the current memory operation, for example, when the word line selected in the current memory operation and the word line to be selected in the next memory operation are the same according to the exemplary embodiment of the present inventive concept described above. Supposing that the memory operation is sequentially performed on each of the word lines WL0 to WL23, the recovery period in the memory operation (for example, the read operation) on the first to fifteenth pages 0 to 14 may be deleted for the first word line WL0. Alternatively, since the second word line WL1 is selected after the memory operation on the sixteenth page 15 is performed, the recovery operation may be performed in the memory operation on the sixteenth page 15.

In an exemplary embodiment of the present inventive concept, it may be determined whether to delete the recovery period based on the determination result regarding whether the data of the read target is the MSB or the LSB. For example, when the memory cell corresponds to the multi-level cell, the memory cells may include a plurality of (for example, four) threshold voltage distributions according to a data storage state. Further, levels of the read voltage for reading the data of the MSB and the read voltage for reading the data of the LSB may be different from each other. For example, the level of the read voltage for reading the data of the MSB may be greater than that of the read voltage for reading the data of the LSB.

As an exemplary embodiment of the present inventive concept, the voltage bias level of the word lines WL0 to WL23 when reading the data of the LSB may be smaller than that of the word lines WL0 to WL23 when reading the data of the MSB. Accordingly, when the first memory operation for reading the data of the LSB and the second memory operation for reading the data of the MSB are sequentially performed, the voltage levels of the word lines WL0 to WL23 may be increased. The change to the voltage levels described above may be performed through the setup period included in the second memory operation. Alternatively, when reading the data of the LSB after reading the data of the MSB, the voltage levels of the word lines WL0 to WL23 may be decreased, and the setup operation may be relatively difficult.

Further, according to an exemplary embodiment of the present inventive concept, the recovery operation on one or more components may be skipped in the memory operation related to the read operation on the LSB. For example, referring to the first word line WL0, while the recovery operation is skipped in the memory operation for reading the pages 0, 2, 4, 6, 8, 10, 12, and 14 including the data of the LSB, the recovery operation may be performed in the memory operation for reading the pages 1, 3, 5, 7, 9, 11, 13, and 15 including the data of the MSB.

As a modifiable exemplary embodiment of the present inventive concept, as described above, the voltage bias levels of the word lines WL0 to WL23 when reading the data of the LSB and the voltage bias levels of the word lines WL0 to WL23 when reading the data of the MSB may be different from each other. Thus the memory device 300 may be controlled so that the recovery operation is performed when a location of the read data is changed. For example, when the data of the LSB is read in both the first and second memory operations, the recovery operation may be skipped in the first memory operation. Alternatively, when the data of the LSB is read in the first memory operation but the data of the MSB is read in the second memory operation, the recovery operation may be performed in the first memory operation.

Further, as a modifiable exemplary embodiment of the present inventive concept, when the selected string selection line SSL is changed, the recovery operation on the string selection line SSL may be selectively performed in the recovery period. For example, even when the recovery operations on the word lines WL0 to WL23 are skipped according to the various kinds of determination results, the recovery period for recovering the string selection line SSL may be included in the first memory operation.

FIG. 18 illustrates an exemplary embodiment of the present inventive concept in which two-bit data is stored in one memory cell. However, exemplary embodiments of the present inventive concept are not limited thereto. For example, bit data including three or more bits may be stored in one memory cell, and whether to delete the recovery period may be determined according to a bit location of the data read from the memory cell.

FIG. 18 illustrates an exemplary embodiment of the present inventive concept in which the recovery period is deleted in the memory operation for reading the data of the LSB. However, exemplary embodiments of the present inventive concept are not limited thereto. For example, when the voltage levels of the word lines WL0 to WL23 have a relatively high value after the sensing period, the voltage levels of the word lines WL0 to WL23 may be controlled to be maintained. However, in this case, the recovery period may be deleted in the memory operation for reading the data of the MSB.

In addition, in the exemplary embodiment illustrated in FIG. 18, an example of determining whether to delete the recovery period based on the result obtained by determining the LSB and the MSB is illustrated. However, exemplary embodiments of the present inventive concept are not limited thereto. For example, since the levels of the read voltages used for reading the data of the LSB and the MSB are different from each other, whether to skip the recovery operation may be determined based on the result obtained by detecting the voltage levels of the word lines WL0 to WL23 used for the read operation.

Figure 19:
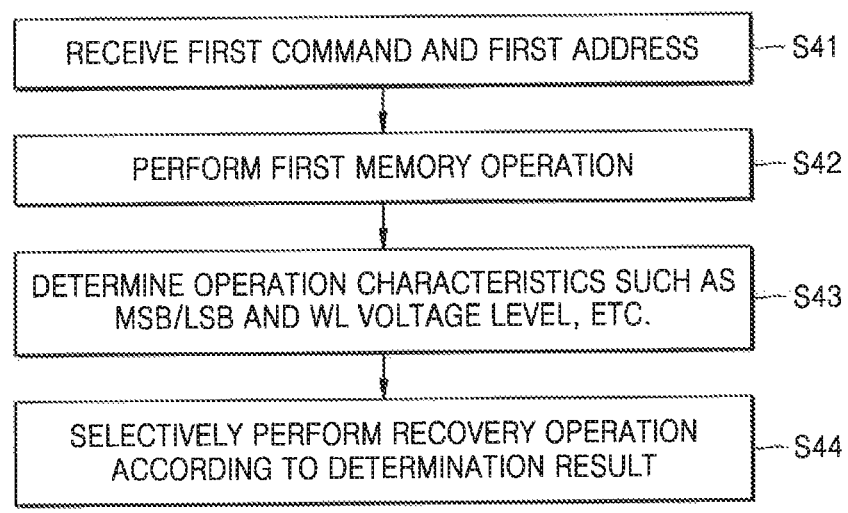
FIG. 19 is a flowchart illustrating an example operation of a memory device according to exemplary embodiments of the present inventive concept.

FIG. 19 is a flowchart illustrating an example operation of a memory device according to exemplary embodiments of the present inventive concept. As an example, the flowchart shown in FIG. 19 illustrates one example of an operation of the memory device 300 shown in FIG. 18.

Referring to FIG. 19, the memory device may receive the first command and the first address (S41), and perform the first memory operation according to the first command (S42). For example, the read operation on the memory cells specified by the first address may be performed.

While the first memory operation is performed, whether to delete the recovery period from the first memory operation may be determined in an exemplary embodiment of the present inventive concept shown in FIG. 19, suppose that the received second command after the first command corresponds to the read command, and the reception timing of the second command satisfies the condition of the exemplary embodiments described above.

To determine whether to delete the recovery period, whether the first memory operation is the read operation on the LSB or the read operation on the MSB may be determined. Alternatively, as described above, levels of various kinds of voltages provided to the word lines may be detected. That is, various operation characteristics related to the first memory operation described above may be determined (S43). The recovery operation may be selectively performed in the first memory operation according to the determination result (S44). For example, a determination that may be made is whether the first reading operation is a reading operation on the most significant bit (MSB) of the multilevel cell. Further, if it is determined that the first reading operation is not the reading operation on the MSB, then the memory operation on the first read command may be completed without performing the recovery operation.

Figure 20:
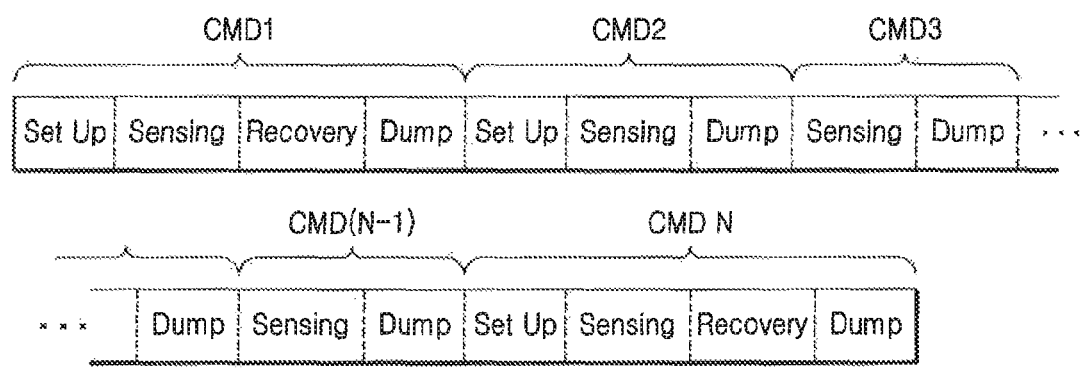
FIG. 20 is a diagram illustrating an example of various kinds of periods included in a memory operation according to exemplary embodiments of the present inventive concept.

FIG. 20 is a diagram illustrating an example of various kinds of periods included in a memory operation according to exemplary embodiments of the present inventive concept.

Referring to FIG. 20, as the first read command CMD1 is received, the first memory operation including the setup period, the sensing period, the recovery period, and the dump period may be performed. It may be assumed that the recovery operation is performed in the first memory operation according to the first read command CMD1.

Further, the second memory operation may be performed according to the second read command CMD2, and the recovery period may be deleted from the second memory operation based on various kinds of determination results according to the exemplary embodiments of the present inventive concept described above. Accordingly, the setup period, the sensing period, and the dump period included in the second memory operation may be sequentially performed. In an exemplary embodiment, if the memory operation on the first read command is completed without performing the recovery operation, the memory operation on the second read command may perform the second sensing operation without first performing a setup operation.

In addition, as the recovery period included in the second memory operation is not performed, the bias condition in the second memory operation may be continuously maintained, and the third memory operation according to the third read command CMD3 may be controlled to be started in a bias condition maintained in the second memory operation. Accordingly, in the third memory operation, only the sensing period and the dump period may be performed, and the setup period and the recovery period may be deleted. According to the method described above, the memory operation on the plurality of read commands CMD1 to CMDN may be performed.

Figure 21:
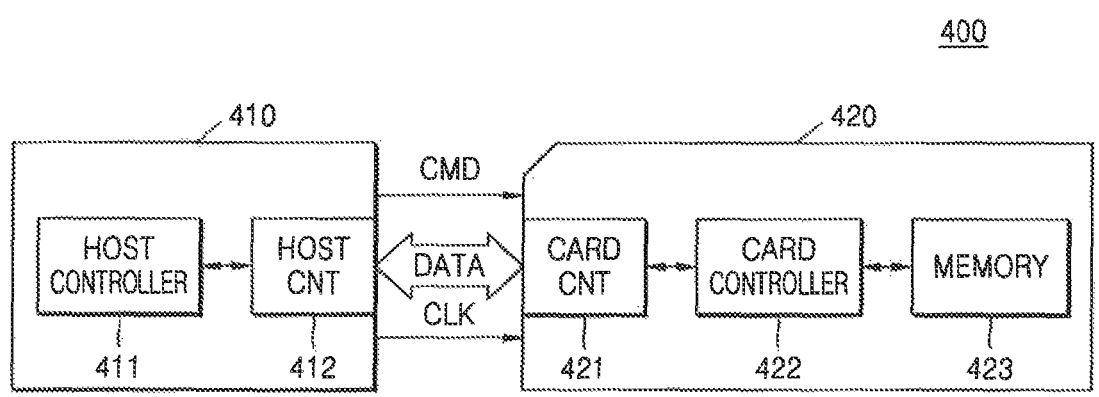
FIG. 21 is a block diagram illustrating an example in which a memory system according to an exemplary embodiment of the present inventive concept is applied to a memory card system.

FIG. 21 is a block diagram illustrating an example in which a memory system according to exemplary embodiments of the inventive concept is applied to a memory card system. As an example, suppose that the memory system is a flash memory system.

Referring to FIG. 21, the memory card system 400 may include a host 410, and a memory card 420. The host 410 may include a host controller 411, and a host connection (CNT) unit 412. The memory card 420 may include a card connection (CNT) unit 421, a card controller 422, and a memory system 423. Further, the memory system 423 may be implemented using the exemplary embodiments of the present inventive concept shown in FIGS. 1 to 20. Accordingly, the memory system 423 may perform the recovery operation or delete the recovery period based on the various kinds of determination results when performing the memory operation according to the exemplary embodiment described above.

The host 410 may store data in the memory card 420, or read the data stored in the memory card 420. The host controller 411 may transfer a command CMD, a clock signal CLK generated by a clock generator inside the host 410, and data DATA to the memory card 420 through the host connection unit 412.

The card controller 422 may provide the data to the memory system 423 in synchronization with the clock signal generated by a clock generator included in the card controller 422 in response to a request received through the card connection unit 421. The memory system 423 may store the data transferred from the host 410.

The memory card 420 may be implemented as, for example, a compact flash card (CFC), a micro drive, a smart media card (SMC), a multimedia card (MMC), a security digital card (SDC), a universal flash storage (UFS) device, a memory stick, a universal serial bus (USB) flash memory driver, etc.

Figure 22:
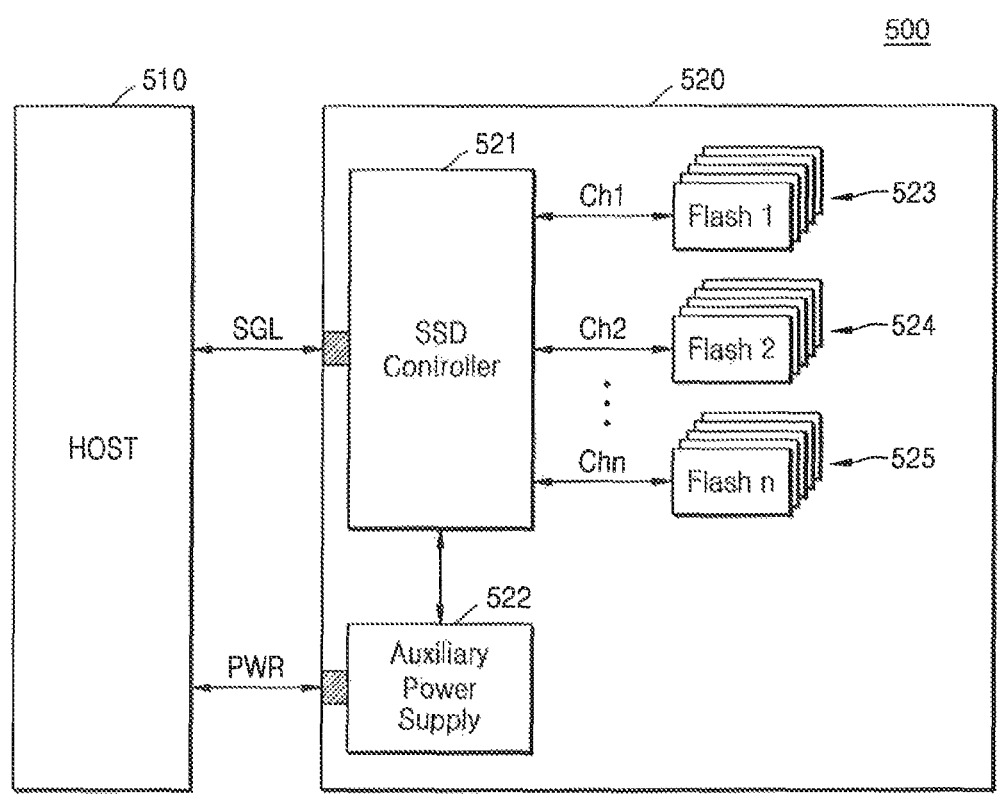
FIG. 22 is a block diagram illustrating an example in which a memory device according to exemplary embodiments of the present inventive concept is applied to a solid state disk/drive (SSD) system.

FIG. 22 is a block diagram illustrating an example in which a memory device according to exemplary embodiments of the inventive concept is applied to a solid state disk/drive (SSD) system.

Referring to FIG. 22, an SSD system 500 may include a host 510, and an SSD 520. The SSD 520 may transceive a signal SGL with the host 510 through a signal connector SGL, and receive power PWR through a power connector. The SSD 520 may include an SSD controller 521, an auxiliary power supply 522, and a plurality of nonvolatile memory systems 523, 524, and 525. Each of the plurality of non-volatile memory systems 523, 524, and 525 may include the memory device according to the exemplary embodiments of the present inventive concept. According to an exemplary embodiment of the present inventive concept, when each of the plurality of non-volatile memory systems 523, 524, and 525 performs the memory operation according to the exemplary embodiments described above, the recovery operation may be performed or the recovery period may be deleted based on the various kinds of determination results.

In the non-volatile memory device and the method of operating the same according to the exemplary embodiments of the inventive concept, it may not be necessary to perform the recovery operation whenever the memory operation is performed. Thus, the time used for the memory operation may be reduced and the latency time of the memory operation may be decreased.

Further, in the non-volatile memory device and the method of operating the same according to the exemplary embodiments of the inventive concept, since the recovery operation is skipped in at least a portion of the memory operation, the power consumption may be reduced.

While the inventive concept has been particularly shown and described with reference to exemplary embodiments of the present inventive concept thereof, it will be understood that various changes in form and detail may be made therein without departing from the spirit and scope of the present inventive concept as defined by the following claims.

What is claimed is:

1. A method of operating a non-volatile memory device, comprising:
   receiving a first read command;
   performing a first sensing operation in response to the first read command;
   receiving a second read command;
   completing a memory operation corresponding to the first read command without performing a recovery operation when the second read command is received before the first sensing operation is completed; and
   performing a second sensing operation in response to the second read command.

2. The method of operating the non-volatile memory device of claim 1, further comprising:
   performing the recovery operation when the second read command is received after the first sensing operation is completed, wherein the recovery operation corresponds to the first read command.

3. The method of operating the non-volatile memory device of claim 2, wherein the recovery operation is performed after the first sensing operation is completed and before the second sensing operation is performed.

4. The method of operating the non-volatile memory device of claim 1, wherein data according to the first sensing operation stored in a page buffer is transferred to an input and output buffer without performing the recovery operation when the second read command is received before the first sensing operation is completed.

5. The method of operating the non-volatile memory device of claim 1, further comprising:
comparing a first row address related to the first read command and a second row address related to the second read command,
wherein the memory operation corresponding to the first read command is completed without performing the recovery operation when the first row address and the second row address are the same.

6. The method of operating the non-volatile memory device of claim 5, further comprising:
comparing a first column address related to the first read command and a second column address related to the second read command,
wherein the memory operation corresponding to the first read command is completed without performing the recovery operation when the first column address and the second column address are different from each other.

7. The method of operating the non-volatile memory device of claim 1, further comprising:
performing the second sensing operation without performing a setup operation when the memory operation corresponding to the first read command is completed without performing the recovery operation.

8. The method of operating the non-volatile memory device of claim 1, further comprising:
determining whether the first sensing operation corresponds to a most significant hit (MSB) of multilevel cell, wherein the non-volatile memory device comprises a memory cell array including the multilevel cell; and
completing the memory operation corresponding to the first read command without performing the recovery operation when the first sensing operation does not correspond to the MSB of the multilevel cell.

9. The method of operating the non-volatile memory device of claim 1, wherein the recovery operation initializes at least one of a word line voltage, a bit line voltage, and a pump output voltage related to the memory operation.

10. The method of operating the nonvolatile memory device of claim 9, wherein an initialization operation corresponding to at least one of the word line voltage, the bit line voltage, and the pump output voltage is skipped when the memory operation corresponding to the first read command is completed without performing the recovery operation.

11. The method of operating the non-volatile memory device of claim 9, wherein an initialization operation corresponding to at least one of the word line voltage, the bit line voltage, and the pump output voltage is skipped in a recovery period when the memory operation corresponding to the first read command includes the recovery period.

12. A method of operating a non-volatile memory device, comprising:
performing a first memory operation in response to a receiving first command and a first address;
receiving a second command and a second address;
determining an amount of time taken to receive the second command; and
selectively deleting a recovery period included in the first memory operation according to the amount of time taken to receive the second command.

13. The method of operating the non-volatile memory device of claim 12, wherein the first memory operation comprises a first sensing period for sensing data, and
the recovery period is deleted from the first memory operation when the second command is received before the first sensing period is completed.

14. The method of operating the non-volatile memory device of claim 13, further comprising:
determining whether the first command and the second command are a read command; and
deleting the recovery period from the first memory operation when the first command and the second command are the read command.

15. The method of operating the non-volatile memory device of claim 12, further comprising:
comparing the first address and the second address,
wherein the recovery period is selectively deleted from the first memory operation according to the amount of time taken to receive the second command and a comparison result indicating whether a first row address included in the first address and a second row address included in the second addresses are the same.

16. The method of operating the non-volatile memory device of claim 12, further comprising:
receiving, continuously, a first command to a N-th command requesting a read operation, wherein N is an integer equal to at least 2, wherein each command corresponds to a memory operation;
deleting recovery periods from memory operations according to some portions of the first to the N-th commands.

17. A method of operating a non-volatile memory device, comprising:
receiving a first read command;
performing a first sensing operation in response to the first read command;
receiving a second command;
determining whether the second command is a second read command;
performing a recovery operation in a first memory operation corresponding to the first read command when the second command is not the second read command;
skipping the recovery operation in the first memory operation corresponding to the first read command when the second command is the second read command and when the second read command is received before the first sensing operation is completed; and
performing second sensing operation in response to the second read command.

18. The method of operating the non-volatile memory device of claim 17, further comprising:
comparing an amount of time taken to receive the second command to a threshold value when the second command is the second read command; and
performing the recovery operation in the first memory operation corresponding to the first read command when the amount of time taken to receive the second command is greater than the threshold value.

19. The method of operating the non-volatile memory device of claim 17, further comprising:

comparing an amount of time taken to receive the second command to a threshold value when the second command is the second read command; and performing the first memory operation corresponding to the first read command without performing the recovery operation when the amount of time taken to receive the second command is less than the threshold value.

20. The method of operating the non-volatile memory device of claim 17, wherein a threshold value corresponds to an amount of time taken to complete a first sensing period included in the first memory operation.

* * * * *